United States Patent
Ndip et al.

(10) Patent No.: US 10,151,783 B2
(45) Date of Patent: Dec. 11, 2018

(54) ANTENNA MEASURING STATION

(71) Applicants: Fraunhofer-Gesellschaft zur Foerderung der angewandten Forschung e.V., Munich (DE); Technische Universitaet Berlin, Berlin (DE)

(72) Inventors: Ivan Ndip, Berlin (DE); Volker Grosser, Rangsdorf (DE); Christian Tschoban, Gross Kreutz (DE); Brian Curran, Oranienburg (DE); Max Huhn, Oranienburg (DE); Klaus-Dieter Lang, Berlin (DE)

(73) Assignees: Fraunhofer-Gesellschaft zur Foerderung der angewandten Forschung e.V., Munich (DE); Technische Universitaet Berlin, Berlin (DE)

( * ) Notice: Subject to any disclaimer, the term of this patent is extended or adjusted under 35 U.S.C. 154(b) by 0 days.

(21) Appl. No.: 15/719,779

(22) Filed: Sep. 29, 2017

(65) Prior Publication Data

US 2018/0088162 A1   Mar. 29, 2018

(30) Foreign Application Priority Data

Sep. 29, 2016   (DE) .................. 10 2016 218 891

(51) Int. Cl.
*H04B 17/12*   (2015.01)
*H04B 3/23*    (2006.01)
(Continued)

(52) U.S. Cl.
CPC .......... *G01R 29/10* (2013.01); *H04B 17/102* (2015.01); *H04B 17/12* (2015.01); *H04B 17/13* (2015.01);
(Continued)

(58) Field of Classification Search
CPC ........ H04B 17/12; H04B 17/14; H04B 17/27; H04B 3/46; H04B 17/19; H04B 17/15;
(Continued)

(56) References Cited

U.S. PATENT DOCUMENTS

| 8,773,966 | B1* | 7/2014 | Petrovic | ............... | H04W 52/04 370/203 |
| 2004/0037214 | A1* | 2/2004 | Blasco Claret | ........ | H04B 3/542 370/203 |

(Continued)

OTHER PUBLICATIONS

S. Ranvier, M. Kyro, C. Icheln und C. Luxey, "Compact 3-D On-Wafer Radiation Pattern Measurement System for 60 GHz Antennas", in Microwave and Optical Technology Letters, vol. 51, No. 2, Feb. 2008.

(Continued)

*Primary Examiner* — Andrew Wendell
(74) *Attorney, Agent, or Firm* — Dicke, Billig & Czaja, PLLC

(57) ABSTRACT

An apparatus and a method for determining an antenna characteristic of an antenna under test in free space is disclosed. Measurement results of a transmitted power of a measurement signal transmitted between the reference antenna and an antenna under test are detected, wherein detecting takes place in the frequency domain. The detected measurement results are transformed into the time domain and a time-domain filter is applied to the measurement results converted into the time domain. A filter width of the time-domain filter is determined in dependence on a spatial distance between the reference antenna and the antenna under test. Measurement result portions that result due to a multipath propagation of the measurement signal between the reference antenna and the antenna under test are reduced or removed.

18 Claims, 14 Drawing Sheets

(51) Int. Cl.
| | |
|---|---|
| H04W 24/08 | (2009.01) |
| G01R 29/10 | (2006.01) |
| H04B 17/13 | (2015.01) |
| H04B 17/14 | (2015.01) |
| H04B 17/27 | (2015.01) |
| H04B 17/10 | (2015.01) |
| H04B 17/318 | (2015.01) |

(52) U.S. Cl.
CPC .............. *H04B 17/14* (2015.01); *H04B 17/27* (2015.01); *H04B 17/318* (2015.01)

(58) Field of Classification Search
CPC .... H04B 3/23; H04W 24/08; H04L 25/03012; H04L 2025/03445; H04L 27/2671; G01R 29/10
See application file for complete search history.

(56) References Cited

U.S. PATENT DOCUMENTS

| | | | | |
|---|---|---|---|---|
| 2005/0226353 | A1* | 10/2005 | Gebara | H01Q 1/521 375/346 |
| 2007/0127559 | A1* | 6/2007 | Chang | H04B 17/0087 375/213 |
| 2012/0027066 | A1* | 2/2012 | O'Keeffe | H01Q 1/246 375/224 |
| 2012/0082199 | A1* | 4/2012 | Blech | H04B 17/12 375/224 |
| 2013/0210346 | A1* | 8/2013 | Ling | H04W 4/80 455/41.1 |
| 2014/0254421 | A1* | 9/2014 | Ahlander | H04L 25/0224 370/252 |
| 2015/0126133 | A1* | 5/2015 | Wang | H04W 24/08 455/67.16 |
| 2017/0244497 | A1* | 8/2017 | Guo | H04B 15/00 |
| 2017/0339569 | A1* | 11/2017 | Khandani | H04W 12/04 |

OTHER PUBLICATIONS

J. Akkermans, R. v. Dijik und M. Herben, "Millimeter-wave antenna measurement", in Proceedings of the 37th European Microwave Conference, Munich, 2007.

H. Gulan, S. Beer, S. Diebold, C. Rusch, A. Leuther, I. Kallfass und T. Zwick, "Probe based antenna measurements up to 325 GHz for upcoming millimeter-wave applications", in International Workshop on in Antenna Technology (iWAT), 2013.

T. Zwick, C. Baks, U. R. Pfeiffer, D. Liu und B. P. Gaucher, "Probe Based MMW Antenna Measurement Setup", in IEEE Antennas and Propagation Society International Symposium, 2004.

S. Beer, G. Adamiuk und T. Zwick, "Design and Probe Based Measurement of 77 GHz Antennas for Antenna in Package Appliations", in Proceedings of the 39th European Microwave Conference, Roma, 2009.

"A-Info," [Online]. Available: http://www.ainfoinc.com/en/p_ant_h_dual.asp. [accessed Oct. 8, 2015].

http://www.ets-lindgren.com/pdf/3115-PA.pdf, "ETS-Lindgren," [Online]. Available: http://www.ets-lindgren.com/pdf/3115-PA.pdf. [accessed Oct. 8, 2015].

Exelisinc, [Online]. Available: http://www.exelisinc.com/capabilities/Antennas/Documents/AS-48461_Series.pdf. [accessed Oct. 8, 2015].

J. Edwards, R. O'Brient, A. Lee und G. Rebeiz, "Dual-Polarized Sinuous Antennas on Extended Hemispherical Silicon Lenses," in IEEE Transactions on Antennas and Propagation, vol. 60, No. 2, Sep. 2012.

G. Adamiuk, T. Zwick und W. Wiesbeck, "Compact, Dual-Polarized UWB-Antenna, Embedded in a Dielectric," in IEEE Transactions on Antennas and Propagation, vol. 58, No. 2, Feb. 2010.

Roger B. Marks: "A Multiline Method of Network Analyzer Calibration", IEEE Transactions on Microwave Theory and Techniques, vol. 39, No. 7, Jul. 1991.

R. V. De Jongh, M. Hajian and L. P. Ligthart, "Antenna time-domain measurement techniques," in IEEE Antennas and Propagation Magazine, vol. 39, No. 5, pp. 7-11, Oct. 1997.

Andrew M. Predoehl: Time Domain Antenna Measurements. Master Thesis, Virginia Polytechnic Institute and State University, USA, Jun. 1996. URL: https://vtechworks.lib.vt.edu/handle/10919/45487, archived in: https://web.archive.org/web/20150925141551/https://vtechworks.lib.vt.edu/handle/10919/45487 on Sep. 25, 2015.

* cited by examiner

ANTENNA MEASURING STATION

CROSS-REFERENCE TO RELATED APPLICATIONS

This application claims priority from German Patent Application No. 10 2016 218 891.7, which was filed on Sep. 29, 2016, and is incorporated herein in its entirety by reference.

The invention relates to a method for determining an antenna characteristic of an antenna under test in free space having the features of claim 1, an apparatus for determining an antenna characteristic of an antenna under test in free space having the features of claim 7 as well as an antenna measuring station for determining an antenna characteristic of an antenna under test in free space (non-reflective) having the features of claim 14.

BACKGROUND OF THE INVENTION

The economic usage of millimeter (mm) and terahertz (THz) waves has significantly increased in recent years. All over the world, the practical usage of mm and THz waves for communication and radar applications is intensively worked on. This frequency range has many important advantages. The most illustrative example is the future wireless video signal transmission, e.g. to beamers, by using the new high-speed WLAN standard IEEE802.11ad in the 60 GHz band, as well as the application of 79 GHz automotive radar for detecting the surroundings of a car in autonomous driving.

However, some physical characteristics of the mm waves are disadvantageous, such as low range due to high attenuation and reflection at many solid and liquid materials. However, by specific technical developments, these disadvantages can be avoided or can even be used specifically for the desired application (e.g. near-field communication).

The central issues in these technical developments are the antennas for optimum transmission and reception of mm and THz waves. Accordingly, antenna development and the involved measurement technology for characterizing the antenna characteristic will play a significant role in the usage of mm and THz waves.

Nowadays, shielded rooms are commonly used for measurement-technology characterization of antennas for mm wave applications. FIG. 15 shows exemplarily a shielded room, as it is currently used in the Institute of Fraunhofer IZM. The antenna measurements are currently very time-consuming and have to be performed by experienced high-frequency (HF) specialists.

These expensive shielded rooms and the need for highly qualified HF specialists for performing the measurements as well as the high time effort for performing the measurements are obstacles for the development of mm and THz wave antennas and the quality control of these antennas in production.

The conventional technology [1] to [5] knows scientific and commercial systems. The systems in science are all based on a similar principle. A linearly polarized standard gain horn antenna is positioned on a rotatable arm. With the help of the arm, the standard gain horn antenna is guided around the antenna to be measured.

Commercial systems are exclusively offered in shielded rooms and together with shielded rooms, respectively, and these systems are based on frequency-domain measurement methods and near-field measurement methods, respectively.

Thus, known systems need a free field for obtaining reproducible measurement results to obtain reliable statements on the characteristics of an antenna under test. However, high effort is needed to realize such free-field conditions artificially, namely by providing a so-called an anechoic room. Thus, a conventional measuring station needs a lot of space (exemplary dimension of the shielded room at the Fraunhofer IZM is 5×3 m$^2$), in particular compared to the actual size of an antenna under test for the millimeter and terahertz range. Additionally, expert personnel are needed for performing the HF measurements.

SUMMARY

According to an embodiment, a method for determining an antenna characteristic of an antenna under test in free space may have the steps of: detecting measurement results of a transmitted power of a measurement signal transmitted between a reference antenna and an antenna under test, wherein detecting takes place in the frequency domain; converting the detected measurement results into the time domain; applying a time-domain filter to the measurement results converted into the time domain, wherein a filter width of the time-domain filter is determined in dependence on a spatial distance between the reference antenna and the antenna under test, such that measurement result portions resulting due to multipath propagation of the measurement signal between the reference antenna and the antenna under test are reduced or removed; converting the filtered measurement results into the frequency domain; and determining the antenna gain $G_T(\vartheta,\varphi)$ of the antenna under test based on the filtered measurement results present in the frequency domain by applying the following equation:

$$G_T(\vartheta, \varphi) = 10\log_{10}\left(\frac{P_{e\_T}}{P_{e\_R}}\right) - 20\log_{10}\left(\frac{\lambda}{4\pi r}\right) - \\ G_{REF}(\vartheta, \varphi) - \left(10\log\left(1 - \left(\frac{P_{e\_T}}{P_{e\_R}}\right)\Big|_{P_{g\_R}=0}\right) + \\ 10\log\left(1 - \left(\frac{P_{g\_T}}{P_{g\_R}}\right)\Big|_{P_{e\_R}=0}\right) + 20\log|\hat{p}_R \cdot \hat{p}_T|\right)$$

According to another embodiment, an apparatus for determining an antenna characteristic of an antenna under test in free space may have: means for detecting measurement results of a transmitted power of a measurement signal transmitted between a reference antenna and an antenna under test, wherein detecting takes place in the frequency domain; a control device that is configured to convert the measurement results into the time domain; and a time-domain filter, wherein the control device is configured to apply the time-domain filter to the measurement results converted into the time domain, wherein a filter width of the time-domain filter is determined in dependence on a spatial distance between the reference antenna and the antenna under test, such that measurement result portions resulting due to multipath propagation of the measurement signal between the reference antenna and the antenna under test are reduced or removed; wherein the control device is further configured to convert the filtered measurement results into the frequency domain; and wherein the control device is further configured to determine the antenna gain $G_T(\vartheta,\varphi)$ of the antenna under test based on the filtered measurement results present in the frequency domain by applying the following equation:

$$G_T(\vartheta, \varphi) = 10\log_{10}\left(\frac{P_{e\_T}}{P_{e\_R}}\right) - 20\log_{10}\left(\frac{\lambda}{4\pi r}\right) -$$
$$G_{REF}(\vartheta, \varphi) - \left(10\log\left(1 - \left(\frac{P_{e\_T}}{P_{e\_R}}\right)\bigg|_{P_{g\_R}=0}\right) + \right.$$
$$\left. 10\log\left(1 - \left(\frac{P_{g\_T}}{P_{g\_R}}\right)\bigg|_{P_{e\_R}=0}\right) + 20\log|\hat{p}_R \cdot \hat{p}_T|\right)$$

According to another embodiment, an antenna measuring station for determining an antenna characteristic of an antenna under test in free space may have: an antenna measuring device with a transmitting module and a receiving module, an antenna under test and a reference antenna, wherein the transmitting module is coupled to at least one of the two antennas and the receiving module is coupled to at least the other one of the two antennas, a time-domain filter, wherein a filter width of the time-domain filter is determined in dependence on a spatial distance between the antenna under test and the reference antenna, and a control device that is configured to control the transmitting module and the receiving module, such that the transmitting module emits a test signal by means of one of the two antennas and the receiving module receives the test signal by means of the other one of the two antennas, and the control device is further configured to convert the test signal received in the frequency domain into the time domain and to apply the time-domain filter to the received test signal in order to filter out test signal portions lying outside the filter width, and wherein the control device is configured to convert the filtered test signal present in the time domain back to the frequency domain, and wherein the control device is further configured to determine, from the test signal converted back to the frequency domain, the antenna gain $G_T(\vartheta,\varphi)$ of the antenna under test in dependence on a determined spatial angle by applying the following equation:

$$G_T(\vartheta, \varphi) = 10\log_{10}\left(\frac{P_{e\_T}}{P_{e\_R}}\right) - 20\log_{10}\left(\frac{\lambda}{4\pi r}\right) -$$
$$G_{REF}(\vartheta, \varphi) - \left(10\log\left(1 - \left(\frac{P_{e\_T}}{P_{e\_R}}\right)\bigg|_{P_{g\_R}=0}\right) + \right.$$
$$\left. 10\log\left(1 - \left(\frac{P_{g\_T}}{P_{g\_R}}\right)\bigg|_{P_{e\_R}=0}\right) + 20\log|\hat{p}_R \cdot \hat{p}_T|\right)$$

Another embodiment may have a non-transitory digital storage medium having a computer program stored thereon to perform the method for determining an antenna characteristic of an antenna under test in free space, the method having the steps of: detecting measurement results of a transmitted power of a measurement signal transmitted between a reference antenna and an antenna under test, wherein detecting takes place in the frequency domain; converting the detected measurement results into the time domain; applying a time-domain filter to the measurement results converted into the time domain, wherein a filter width of the time-domain filter is determined in dependence on a spatial distance between the reference antenna and the antenna under test, such that measurement result portions resulting due to multipath propagation of the measurement signal between the reference antenna and the antenna under test are reduced or removed; converting the filtered measurement results into the frequency domain; and determining the antenna gain $G_T(\vartheta,\varphi)$ of the antenna under test based on the filtered measurement results present in the frequency domain by applying the following equation:

$$G_T(\vartheta, \varphi) = 10\log_{10}\left(\frac{P_{e\_T}}{P_{e\_R}}\right) - 20\log_{10}\left(\frac{\lambda}{4\pi r}\right) -$$
$$G_{REF}(\vartheta, \varphi) - \left(10\log\left(1 - \left(\frac{P_{e\_T}}{P_{e\_R}}\right)\bigg|_{P_{g\_R}=0}\right) + \right.$$
$$\left. 10\log\left(1 - \left(\frac{P_{g\_T}}{P_{g\_R}}\right)\bigg|_{P_{e\_R}=0}\right) + 20\log|\hat{p}_R \cdot \hat{p}_T|\right)$$

when said computer program is run by a computer.

The inventive method offers the great advantage that an antenna characteristic of an antenna under test can be determined in free space. Here, it is essential to distinguish the term free space from the above-mentioned term free field. A free field relates to a field situation where no reflections occur at all. Free-field conditions can be generated artificially in anechoic rooms and shielded rooms, respectively. However, with the inventive method it is possible to test the antenna in free space, i.e. in an arbitrary room that does not necessarily have to be anechoic. Thus, the inventive method can be performed, for example, in almost any (laboratory) room, for determining an antenna characteristic of an antenna under test. Thus, with the inventive method, there is no longer any need for providing shielded rooms with specific wave-shielding and/or shielding materials and absorbent materials, respectively. In the inventive method, a measurement signal is transmitted between a reference antenna and an antenna under test. The measurement results of the transmitted power of this measurement signal are detected in the frequency domain. The detected measurement results are subsequently converted into the time domain. Additionally, a time-domain filter is provided, e.g. in the form of a bandpass (lets power pass only in a specific time domain). The filter width of this time-domain filter is determined, among others, in dependence on a spatial distance between the reference antenna and the antenna under test. This spatial distance is, for example, a shortest distance between the two antennas. This also characterizes the so-called direct path of signal transmission. When knowing the signal parameters of a measurement signal, e.g. the wavelength, the propagation time between the two antennas in the direct path can be determined. On the other hand, signal portions that are not transmitted in the direct path have longer propagation times, since the same are reflected, for example, at obstacles in the surroundings and arrive at the receiver as reflected signal portions having a longer propagation time. These signal portions are transmitted on an indirect path in the form of a so-called multipath propagation between the reference antenna and the antenna under test. Thus, the time-domain filter can be selected such that only the signal portions transmitted on the direct path can pass the filter. Measurement result portions resulting due to multipath propagation of the measurement signal between the reference antenna and the antenna under test are thus removed. A tolerance of, for example, ±10% or ±20% of the signal propagation time on the direct path can also be adjusted. Measurement result portions that result due to multipath propagation of the measurement signal between the reference antenna and the antenna under test are hence reduced. Thus, according to the invention, a time-domain filter is applied to the measurement results converted into the time domain, wherein the filter width of the time-domain filter is determined in dependence on a spatial distance between the reference antenna and the antenna under test, such that measurement result portions resulting due to multipath propagation of the measurement signal between the reference antenna and the antenna under test are reduced or removed. After applying the time-domain filter, the filtered measurement results are again converted into the frequency domain. Then, with the inventive method, the antenna gain $G_T(\vartheta,\varphi)$ of the antenna under test is determined based on the filtered measurement results present in the frequency domain by applying the following equation:

$$G_T(\vartheta, \varphi) = 10\log_{10}\left(\frac{P_{e\_T}}{P_{e\_R}}\right) - 20\log_{10}\left(\frac{\lambda}{4\pi r}\right) -$$
$$G_{REF}(\vartheta, \varphi) - \left(10\log\left(1 - \left(\frac{P_{e\_T}}{P_{e\_R}}\right)\bigg|_{P_{g\_R}=0}\right) + \right.$$
$$\left. 10\log\left(1 - \left(\frac{P_{g\_T}}{P_{g\_R}}\right)\bigg|_{P_{e\_R}=0}\right) + 20\log|\hat{p}_R \cdot \hat{p}_T|\right)$$

wherein
  $G_T(\vartheta,\varphi)$ designates the antenna gain of the antenna under test (AUT) in dependence on the spatial angle, i.e. an azimuth angle $\varphi$ and an elevation angle $\vartheta$,
  $G_{REF}(\vartheta,\varphi)$ designates the antenna gain of the reference antenna in dependence on the spatial angle, i.e. an azimuth angle $\varphi$ and an elevation angle $\vartheta$,
  $P_{g\_R}$ designates the power of a signal flowing into the reference antenna (transmitting),
  $P_{g\_T}$ designates the power of a signal flowing out of the reference antenna (receiving),
  $P_{e\_R}$ designates the power of a signal flowing into the antenna under test (transmitting) and
  $P_{e\_T}$ designates the power of a signal flowing out of the antenna under test (receiving).
  Polarization losses occur in that an angle lies between the unit vector of the electric field vector of the antenna under test ($\hat{p}_T$) and the one of the reference antenna ($\hat{p}_R$).
  Reflections occur at the transition from the cable to the respective antenna, since a discontinuity exists between the characteristic impendence of cable and antenna. This effect is considered in the above equation by the two terms $$10\log\left(\frac{P_{e\_T}}{P_{e\_R}}\right)\bigg|_{P_{gR}=0}$$

(antenna under test) and $$10\log\left(\frac{P_{g\_T}}{P_{g\_R}}\right)\bigg|_{P_{eR}=0}$$

(reference antenna).
  Thus, by means of the inventive method, the antenna gain $G_T(\vartheta,\varphi)$ of an antenna under test can be determined in dependence on the spatial angle and by considering reflection and polarization losses. Here, it should be noted again that the inventive method is suitable, in contrary to conventional technology, to determine the antenna gain in free space, i.e. without the need of using a shielded room.

According to an embodiment of the inventive method, when detecting the measurement results, the reference antenna can be moved to different measuring positions relative to the antenna under test, and in the different measuring positions, the power of a measurement signal transmitted via a free-space path can be detected at a specific wavelength A and the spatial distance between the reference antenna and the antenna under test in the frequency domain for different spatial angles $(\vartheta,\varphi)$ with elevation angle $\vartheta$ and azimuth angle $\varphi$. A measuring position means the orientation of the antenna under test relative to the reference antenna. The antenna under test can be rotatable in a first (e.g. horizontal) plane, advantageously by 360°. In a second (e.g. vertical) plane perpendicular to the first plane, the reference antenna can be movable by ±90° relative to the antenna under test. Thus, a complete sphere can be mapped around the antenna under test in which also the antenna gain of the antenna under test can be determined.

According to further embodiments of the inventive method, an input reflection factor $$\left(\frac{P_{e\_T}}{P_{e\_R}}\right)\bigg|_{P_{g\_R}=0}$$

of the antenna under test and an input reflection factor of the reference antenna $$\left(\frac{P_{g\_T}}{P_{g\_R}}\right)\bigg|_{P_{e\_R}=0}$$

can be determined. For this, for example a VNA (vector network analyzer) can be used, which has been calibrated via an electric calibration module (eCal) that is easy to operate. An electric calibration module includes all obligatory calibration standards (line, reflection standard, e.g. open or short-circuit lines and a very short line) and can switch electronically to the respectively needed standards which significantly accelerates calibration. Thus, the electric influences of the cables and the measuring device tolerances to the two antennas are considered. Thus, the antenna gain $G_T(\vartheta,\varphi)$ of the antenna under test is hence determined by considering the detected input reflection factors in that these input reflection factors are incorporated as terms into the inventive equation.

According to further embodiments of the inventive method, the measurement signal power $P_{g\_R}$ flowing into the reference antenna and the measurement signal power $P_{e\_T}$ flowing out of the antenna under test can be detected for different spatial angles $\vartheta$, $\varphi$. Above that, polarization losses can be detected based on an angle between the unit vector of the electric field vector $\hat{p}_T$ of the antenna under test and the electric filed vector $\hat{p}_R$ of the reference antenna. Thus, the antenna gain $G_T(\vartheta,\varphi)$ of the antenna under test is determined by considering the detected measurement signal powers and polarization losses in that these field vectors are incorporated as terms into the inventive equation.

According to further embodiments of the inventive method, when detecting the polarization losses, the polarization of the reference antenna can be rotated by 90° relative to the polarization of the antenna under test (electrically or mechanically). In that way, polarization losses can be determined.

According to further embodiments of the inventive method, the spatial distance and/or the orientation between the antenna under test and the reference antenna can be detected by means of laser radiation. This can be performed, for example by means of a laser measurement device measuring the distance and the angle between the two antennas.

A further aspect of the invention provides an apparatus for determining an antenna characteristic of an antenna under test in free space. Among others, the apparatus comprises means for detecting measurement results of a transmitted power of a measurement signal transmitted between a reference antenna and an antenna under test. Here, detecting the measurement results is performed in the frequency domain. Additionally, the inventive apparatus comprises a control device that is configured to convert the measurement results into the time domain. Further, the apparatus comprises a time-domain filter. The control device is configured to apply the time-domain filter to the measurement results converted into the time domain, wherein a filter width of the time-domain filter is determined in dependence on a spatial distance between the reference antenna and the antenna under test. By applying the time-domain filter to the measurement results, measurement result portions resulting due to multipath propagation of the measurement signal between the reference antenna and the antenna under test are reduced or removed. Additionally, the control device is configured to convert the filtered measurement results into the frequency domain and to determine the antenna gain of the antenna under test based on the filtered measurement results present in the frequency domain by applying the following equation:

$$G_T(\vartheta, \varphi) = 10\log_{10}\left(\frac{P_{e\_T}}{P_{e\_R}}\right) - 20\log_{10}\left(\frac{\lambda}{4\pi r}\right) -$$
$$G_{REF}(\vartheta, \varphi) - \left(10\log\left(1 - \left(\frac{P_{e\_T}}{P_{e\_R}}\right)\bigg|_{P_{g\_R}=0}\right) + \right.$$
$$\left. 10\log\left(1 - \left(\frac{P_{g\_T}}{P_{g\_R}}\right)\bigg|_{P_{e\_R}=0}\right) + 20\log|\hat{p}_R \cdot \hat{p}_T|\right)$$

For discussing the individual terms, reference is made to the above-statements concerning the inventive method.

According to embodiments of the present invention, the apparatus can comprise means for moving the reference antenna relative to the antenna under test in different measuring positions, and the control device can be configured to detect, in the different measuring positions, the respective power of the measurement signal transmitted via a free-space path at the frequency f and the spatial distance between the reference antenna and the antenna under test in the frequency domain for different spatial angles $\vartheta$, $\varphi$ with elevation angle $\vartheta$ and azimuth angle $\varphi$.

According to further embodiments of the present invention, the means for detecting measurement results can be configured to determine an input reflection factor $$\left(\frac{P_{e\_T}}{P_{e\_R}}\right)\bigg|_{P_{g\_R}=0}$$

of the antenna under test and an input reflection factor of the reference antenna $$\left(\frac{P_{g\_T}}{P_{g\_R}}\right)\bigg|_{P_{e\_R}=0}.$$

Here, the control device can be configured to determine the antenna gain $G_T(\vartheta,\varphi)$ of the antenna under test by applying the inventive equation and by considering the input reflection factors, wherein the input reflection factors are incorporated as terms in the inventive equation.

According to further embodiments of the present invention, the means for detecting measurement results can be configured to detect the measurement signal power $P_{g\_R}$ flowing into the reference antenna and the measurement signal power $P_{e\_T}$ flowing out of the antenna under test for different spatial angles $\vartheta$, $\varphi$. By means of the detected measurement signal powers, reflection losses can be considered. Above that, the means for detecting the measurement results can be configured to detect an angle between the unit vector of the electric field vector ($\hat{p}_T$) of the antenna under test and the electric field vector ($\hat{p}_R$) of the reference antenna. By means of the detected angles, polarization losses can be considered. Here, the control device is configured to determine the antenna gain $G_T(\vartheta,\varphi)$ of the antenna under test by considering the reflection losses and polarization losses.

According to further embodiments of the present invention, the means for detecting measurement results can further comprise a transmitting stage comprising a mixer, an amplifier, a switching matrix and a transmitting antenna in signal direction. Thus, in the transmitting stage, by means of the mixer, a signal to be transmitted can be mixed up to an intermediate frequency and can be amplified by means of the amplifier. With the switching matrix, switching can then be performed, for example, between the antenna or the calibration module, essentially in a lossless and uncomplicated manner. Thus, the amplified signal can be passed on either to the antenna or the calibration module.

According to further embodiments of the present invention, the means for detecting measurement results can comprise a receiving stage comprising a receiving antenna, a switching matrix, an amplifier and a mixer in signal direction. In that way, the receiving stage can amplify a received signal by means of the amplifier and can downmix the same to a signal frequency by means of the mixer. By means of the switching matrix, switching can be performed between the receiving antenna and a calibration module in the receiving stage. It would also be possible that switching is performed between different intermediate frequency generators (e.g. local oscillators) having different frequency domains by means of the switching matrix.

According to further embodiments of the present invention, the control device can be configured to control the transmitting stage and/or the receiving stage such that the polarization of the transmitting stage is rotated by 90° relative to the receiving stage, wherein the rotation takes place by controlling the switching matrix of the transmitting stage and/or the receiving stage. Thus, by means of the switching matrix, the polarization of the reference antenna can be rotated by 90° relative to the antenna under test, essentially in a lossless and uncomplicated manner. In that way, the switching matrix saves manual switching of the polarization of a dual-polarized antenna and in particular manual twisting of known linearly polarized standard gain horn antennas.

A further aspect of the invention relates to an antenna measuring station for determining an antenna characteristic of an antenna under test in free space. Here, again, the difference between the terms free field and free space is stated explicitly. It is essential to distinguish the term free space from the term free field. A free field relates to a sound and field situation, respectively, where no reflections occur at all. Free-field conditions can be generated artificially in anechoic rooms and shielded rooms, respectively. However, with the inventive antenna measuring station, it is possible to test the antenna in free space, i.e. in an arbitrary room that does not necessarily have to be anechoic. Thus, the inventive antenna measuring station can be installed, for example, in almost any (laboratory) room for determining an antenna characteristic of an antenna under test. Thus, with the inventive antenna measuring station, there is no longer any need for providing shielded rooms with specific wave shielding and/or shielding material and absorbent material, respectively. Among others, the inventive antenna measuring station comprises an antenna measuring device having a transmitting module and a receiving module. The antenna measuring device can generate measurement signals and test signals, respectively, can transmit the same by means of the transmitting module, receive the same by means of the receiving module and measure the received signal, e.g. as regards to signal strength and the same. Additionally, the antenna measuring station comprises an antenna under test and a reference antenna. The transmitting module is coupled to at least one of the two antennas, e.g. by means of a suitable signal line. This means the transmitting module can be coupled, for example, to the reference antenna. Then, the transmitting module would send a test signal by means of the reference antenna. The same also applies vice-versa when the transmitting module would be coupled to the antenna under test. The receiving module is coupled to the respective other one of the two antennas. I.e., when the transmitting module is coupled to the reference antenna, the receiving module would be coupled to the antenna under test. Additionally, the antenna measuring station comprises a control device fulfilling a plurality of different functions. Among others, the control device is configured to control the transmitting module and the receiving module, such that the transmitting module emits a test signal by means of one of the two antennas and the receiving module receives the test signal in the frequency domain by means of the other of the two antennas. Thus, the receiving module coupled to the antenna measuring device passes the received signal on to the antenna measuring device which processes the received signal in the frequency domain. Further, the antenna measuring station comprises a time-domain filter, e.g. a bandpass filter. Here, the filter width of the time-domain filter is determined in dependence on a spatial distance between the antenna under test and the reference antenna. This spatial distance is, for example, the shortest distance between the two antennas. This also characterizes the so-called direct path of signal transmission. When knowing the signal parameters of a measurement signal, e.g. the wavelength, the propagation time between the two antennas in the direct path can be determined. On the other hand, signal portions that are not transmitted in the direct path have longer propagation times, since the same are reflected, for example, at obstacles in the surroundings and arrive at the receiver as reflected signal portions having a respective longer propagation time. These signal portions are transmitted on an indirect path in the form of a so-called multipath propagation between the reference antenna and the antenna under test. Thus, the time-domain filter can be selected such that only signal portions transmitted on the direct path can pass the filter. Measurement result portions resulting due to multipath propagation of the measurement signal between the reference antenna and the antenna under test are thus removed. A tolerance of, for example, ±10% or ±20% of the signal propagation time of a signal transmitted on the direct path can also be adjusted. Measurement result portions that result due to multipath propagation of the measurement signal between the reference antenna and the antenna under test are hence reduced. Signal portions that are outside the selected filter width are filtered out. For this, the control device is structurally configured to convert the test signal received in the frequency domain into the time domain and to apply the time-domain filter to the received test signal in order to filter out test signal portions that are outside the filter width. Above that, the control device is configured to convert the filtered test signal present in the time domain back to the frequency domain. Above that, the control device is configured to determine the antenna gain of the antenna under test from the test signal converted back to the frequency domain by applying the following equation:

$$G_T(\vartheta, \varphi) = 10\log_{10}\left(\frac{P_{e\_T}}{P_{g\_R}}\right) - 20\log_{10}\left(\frac{\lambda}{4\pi r}\right) -$$
$$G_{REF}(\vartheta, \varphi) - \left(10\log\left(1 - \left(\frac{P_{e\_T}}{P_{e\_R}}\right)\Big|_{P_{g\_R}=0}\right) +\right.$$
$$\left. 10\log\left(1 - \left(\frac{P_{g\_T}}{P_{g\_R}}\right)\Big|_{P_{e\_R}=0}\right) + 20\log|\hat{p}_R \cdot \hat{p}_T|\right)$$

wherein
- $G_T(\vartheta,\varphi)$ designates the antenna gain of the antenna under test (AUT) in dependence on the spatial angle, i.e. an azimuth angle $\varphi$ and an elevation angle $\vartheta$,
- $G_{REF}(\vartheta,\varphi)$ designates the antenna gain of the reference antenna in dependence on the spatial angle, i.e. an azimuth angle $\varphi$ and an elevation angle $\vartheta$,
- $P_{g\_R}$ designates the power of a signal flowing into the reference antenna (transmitting),
- $P_{g\_T}$ designates the power of a signal flowing out of the reference antenna (receiving),
- $P_{e\_R}$ designates the power of a signal flowing into the antenna under test (transmitting) and
- $P_{e\_T}$ designates the power of a signal (receiving) flowing out of the antenna under test.

Polarization losses occur in that an angle lies between the unit vector of the electric field vector of the antenna under test ($\hat{p}_T$) and the one of the reference antenna ($\hat{p}_R$).

Reflections occur at the transition from the cable to the respective antenna, since a discontinuity exists between the characteristic impendence of cable and antenna. This effect is considered in the above equation by the two terms $$10\log\left(\frac{P_{e\_T}}{P_{e\_R}}\right)\Big|_{P_{g\_R}=0}$$

(antenna under test) and $$10\log\left(\frac{P_{g\_T}}{P_{g\_R}}\right)\Big|_{P_{e\_R}=0}$$

(reference antenna).

Thus, by means of the inventive antenna measuring station, the antenna gain $G_T(\vartheta,\varphi)$ of an antenna under test can be determined in dependence on the spatial angle and by considering reflection and polarization losses. Here, it should be noted again that the inventive method is suitable, in contrary to conventional technology, to determine the antenna gain in free space, i.e. without the need of using a shielded room.

According to embodiments of the invention, the reference antenna and/or the antenna under test can be configured to transmit and/or receive radiation in a frequency range between 1 GHz and 10 THz, or between 50 GHz and 1.1 THz, or between 50 GHz and 100 GHz. These are millimeter and terahertz waves, respectively. These antennas will be applied, for example, in future wireless video signal transmissions, e.g. beamers, when using the new high-speed WLAN standard IEEE802.11ad in the 60 GHz band. Further application examples for such antennas are the fifth generation of the mobile communication standard 5G, E-band wireless Backhaul or also future 100 Gbps wireless communication applications by using frequencies around 0.3 THz. Also possible is the usage of such antennas in 79 GHz automotive radar for detecting the surroundings of a vehicle in autonomous driving but also a 94 GHz radar as well as future industry radar applications in the ranges 0.122 THz and 0.24 THz.

According to further embodiments of the inventive antenna measuring station, the control device can be configured to determine the spatial distance between the reference antenna and the antenna under test and/or the orientation of the reference antenna relative to the antenna under test. This is particularly advantageous prior to a measurement. This can take place either prior to each individual measurement but also prior to a measurement block consisting of several individual measurements. By determining the distance of the two antennas to one another, the direct path for determining the signal propagation time and hence for determining the filter width of the time-domain filter can be determined. By determining the (angular) position of the two antennas relative to one another, polarization losses can be compensated.

According to further embodiments of the inventive antenna measuring station, the antenna measuring station can comprise a laser measuring device that is configured to determine the spatial distance and/or an angle of the reference antenna relative to the antenna under test. A laser measuring device operates very precisely and is suitable for distance and angular measurements with very small tolerances. This significantly increases the accuracy when calculating the antenna gain of the antenna under test.

According to further embodiments of the inventive antenna measuring station, the receiving stage can comprise, in the signal propagation direction of the test signal, a switching matrix, an amplifier and a mixer. In that way, the receiving stage can amplify a received signal by means of the amplifier and can downmix the same to a signal frequency by means of the mixer. In the receiving stage, for example, switching can be performed between the receiving antenna and the calibration module by means of the switching matrix. It would also be possible that switching between different intermediate frequency generators (e.g. local oscillators) having different frequency domains can be performed by means of the switching matrix.

According to further embodiments of the inventive antenna measuring station, the transmitting stage can comprise, in signal propagation direction of the test signal, a mixer, an amplifier and a switching matrix. In that way, in the transmitting stage, a signal to be transmitted can be mixed up to an intermediate frequency by means of the mixer and can be amplified by means of the amplifier. By means of the switching matrix, switching between the antenna or the calibration module, for example, can be performed essentially in a lossless and uncomplicated manner. In that way, the amplified signal can be forwarded either to the antenna or to the calibration module.

According to further embodiments of the inventive antenna measuring station, the reference antenna can be a dual-polarized antenna and the control device can be configured to rotate the polarization of the reference antenna by 90° by means of the switching matrix. The switching matrix can be implemented as a mechanical and/or electrical switch that can switch between at least two states. In that way, for example with an electric switch, switching between a first and second polarization of a dual-polarized antenna can be performed with an electric switch in an essentially lossless manner.

According to further embodiments of the inventive antenna measuring station, the antenna measuring station can comprise a rotatable table on which the antenna under test can be disposed. For example, the table can be a motor-driven table, wherein the control device is configured to rotate the table. The antenna under test disposed on the table can be contacted electrically, for example by means of a probe or also by means of plugs. As mentioned above, the control device can be configured to rotate the table such that during the rotation of the table the antenna under test rotates together with the table in a first plane (horizontal antenna plane). By this rotation, an azimuth angle $\varphi$ between the reference antenna and the antenna under test is changed. The table can be rotatable by 360°. Additionally, the table can be continuously rotatable. In that way, the entire horizontal antenna plane can be scanned for measuring the antenna under test.

According to further embodiments of the inventive antenna measuring station, the antenna measuring station can comprise a receiving device for movably receiving the reference antenna. Such a receiving device can, for example, be a support and arm, respectively, where the reference antenna is disposed in a movable manner. This can be a semi-circular arm that extends at least in portions around the rotatable table. Here, the control device can be configured to move the reference antenna along the receiving device relative to the antenna under test in a second plane (vertical antenna plane) perpendicular to the first plane. In that way, an elevation angle $\vartheta$ between the reference antenna and the antenna under test can be changed.

According to further embodiments of the inventive antenna measuring station, the antenna measuring station can comprise a test signal generator. The test signal generator can be a component of the antenna measuring device. Here, the test signal generator can be configured to generate the test signal and forward the same to the transmitting module. The transmitting module comprises a first integrated transmitting stage and a second integrated transmitting stage. The first transmitting stage comprises a frequency mixer for upmixing the test signal into a first frequency band and the second transmitting stage comprises a frequency mixer for upmixing the test signal into a second frequency band. The frequency bands differ but can also at least overlap to a certain extent. For example, the frequency band of the first transmitting stage can cover a range between 70 GHz to 110 GHz and the frequency band of the second transmitting stage can cover a range between 110 GHz to 170 GHz. Also, more than two transmitting stages having different frequency bands can exist. The transmitting module does comprise a switch for selectively selecting the respective transmitting stage. In that way, several transmitting stages can be integrated in a single transmitting module. Again, switching between the individual transmitting stages can be performed simply with a switch such that a test signal to be transmitted can be mixed up to different frequency bands.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
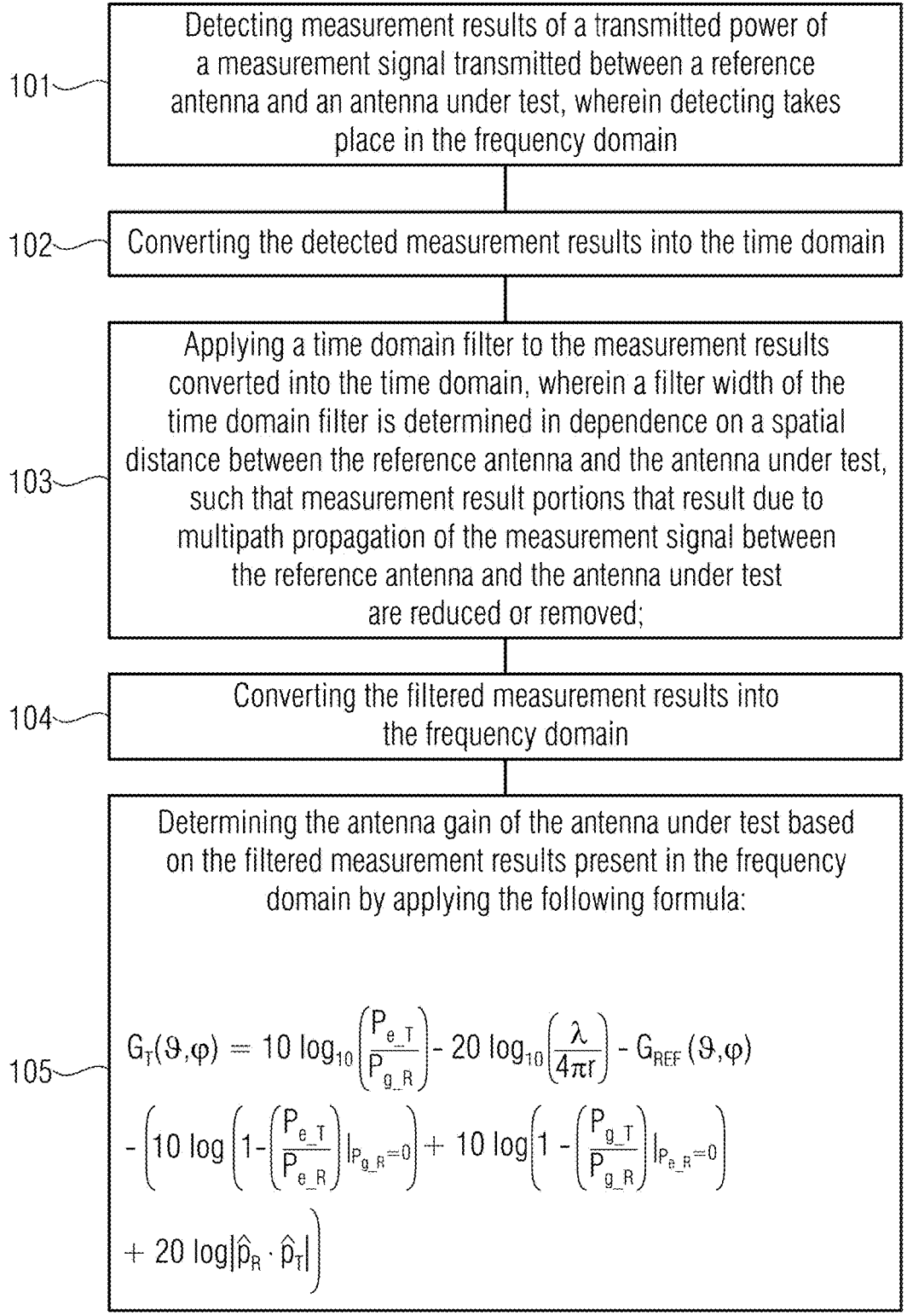
FIG. 1 is a block diagram of an inventive method.

First, the inventive method will be described with reference to FIG. 1.

In block 101, measurement results of a transmitted power of a measurement signal transmitted between a reference antenna and an antenna under test are detected, wherein detecting takes place in the frequency domain.

In block 102, detected measurement results are converted into the time domain.

In block 103, a time-domain filter is applied to the measurement results converted into the time domain, wherein a filter width of the time-domain filter is determined in dependence on a spatial distance between the reference antenna and the antenna under test, such that measurement result portions resulting due to multipath propagation of the measurement signal between the reference antenna and the antenna under test are reduced or removed.

In block 104, the filtered measurement results are converted into the frequency domain.

In block 105, the antenna gain $G_T(\vartheta,\varphi)$ of the antenna under test is determined based on the filtered measurement results present in the frequency domain by applying the following equation:

$$G_T(\vartheta, \varphi) = 10\log_{10}\left(\frac{P_{e\_T}}{P_{g\_R}}\right) - 20\log_{10}\left(\frac{\lambda}{4\pi r}\right) - \\ G_{REF}(\vartheta, \varphi) - \left(10\log\left(1 - \left(\frac{P_{e\_T}}{P_{e\_R}}\right)\right)\Big|_{P_{g\_R}=0}\right) + \\ 10\log\left(1 - \left(\frac{P_{g\_T}}{P_{g\_R}}\right)\right)\Big|_{P_{e\_R}=0}\right) + 20\log|\hat{p}_R \cdot \hat{p}_T|\right)$$

Equation (1)

Figure 2:
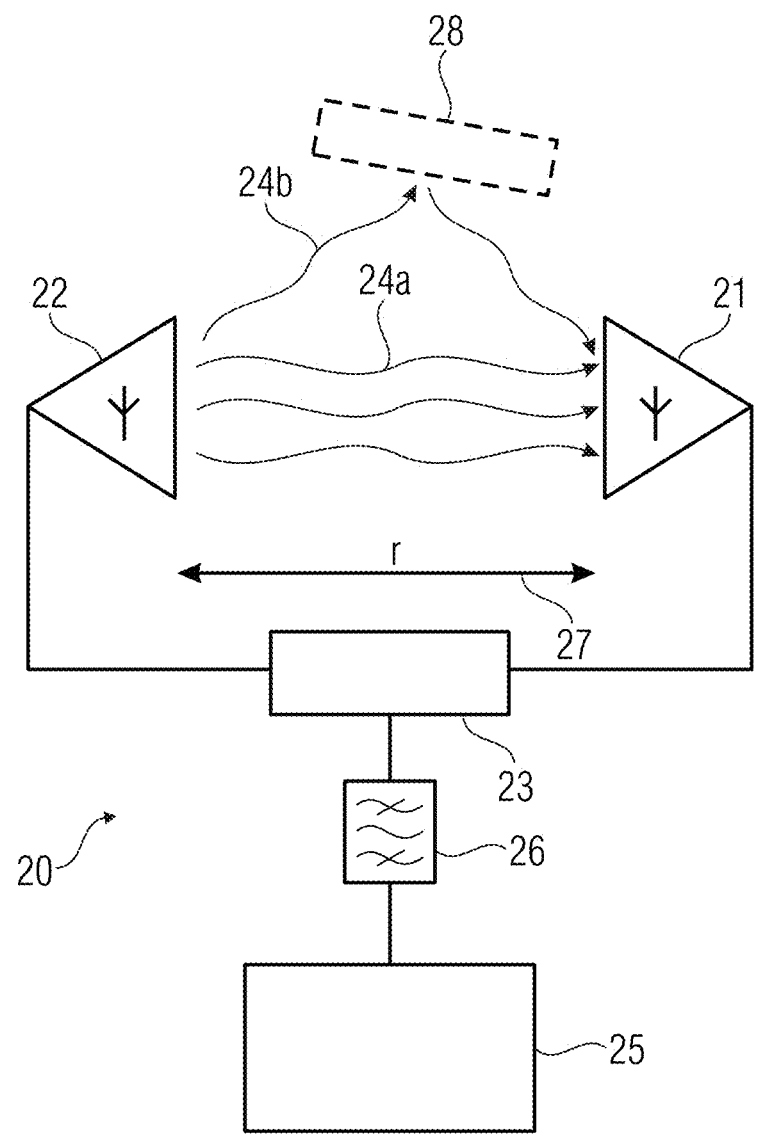
FIG. 2 is a block diagram of an inventive apparatus.

FIG. 2 shows an apparatus 20 for determining an antenna characteristic of an antenna under test 21 in free space.

The apparatus 20 comprises means 23 for detecting measurement results of a transmitted power of a measurement signal 24a, 24b transmitted between a reference antenna 22 and an antenna under test 21. Detecting the measurement results takes place in the frequency domain.

Further, the apparatus 20 comprises a control device 25. The control device 25 is configured to convert the measurement results into the time domain.

Additionally, the apparatus 20 comprises a time-domain filter 26. The control device 25 is configured to apply the time-domain filter 26 to the measurement results converted into the time domain.

A filter width of the time-domain filter 26 is determined in dependence on a spatial distance r between the reference antenna 22 and the antenna under test 21. This will be discussed in more detail below with reference to FIGS. 4 and 5.

The distance r, illustrated by arrow 27 between the reference antenna 22 and the antenna under test 21 simultaneously represents the direct path of signal transmission. This means the signal portions 24a that are transmitted on the direct path from the reference antenna 22 to the antenna under test 21 have the shortest signal propagation time.

Apart from that, there are signal portions 24b that are not transmitted on the direct path. These signal portions can, for example, be reflected at objects 28 existing in the surroundings. These reflected signal portions 24b have a respective longer signal propagation time since the same have to cover a longer path compared to the signal portions 24a transmitted on the direct path. The reflective signal portions 24b are, so to speak, a multipath propagation, i.e. the same are transmitted via an indirect path between the reference antenna 22 and the antenna under test 21.

The filter width of the time-domain filter 26 is adjusted such that those measurement results portions 24b that result due to multipath propagation of the measurement signal between the reference antenna 22 and the antenna under test 21 are reduced or removed.

According to the invention, the control device 25 is configured to convert the filtered measurement results into the frequency domain. Further, the control device 25 is configured to determine the antenna gain of the antenna under test 21 based on the filtered measurement results present in the frequency domain by applying Equation (1).

Figure 3:
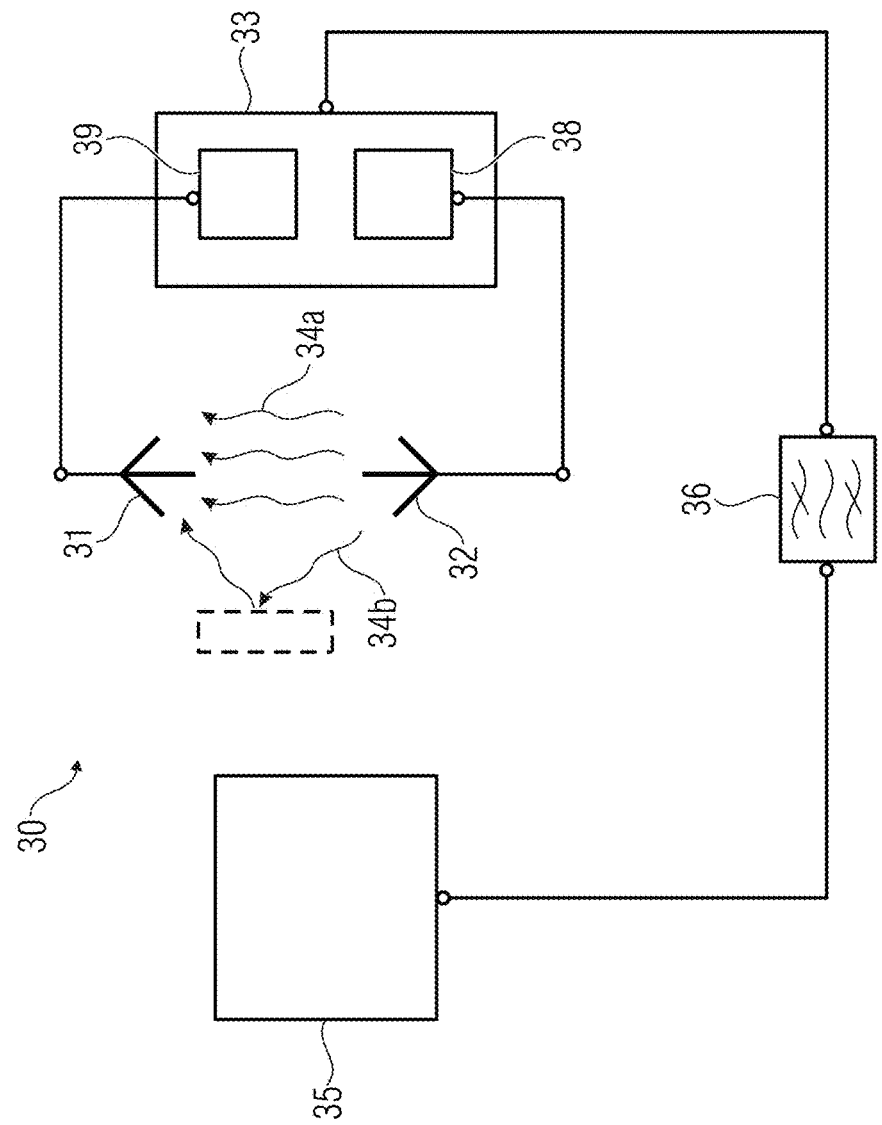
FIG. 3 is a block diagram of an inventive antenna measuring station.

FIG. 3 shows an inventive antenna measurement station 30 for determining an antenna characteristic of an antenna under test 31 in free space. Among others, the antenna measuring station 30 comprises an antenna measuring device 33 having a transmitting module 38 and a receiving module 39.

Additionally, the antenna measuring station 30 comprises an antenna under test 31 and a reference antenna 32. The transmitting module 38 is coupled to at least one of the two antennas 31, 32. In the embodiment shown in FIG. 3, the transmitting module 38 is coupled to the reference antenna 32. It is also possible that the transmitting module 38 is coupled to the antenna under test 31. It would also be possible that the transmitting module 38 is coupled to both antennas 31, 32.

The receiving module 39 is coupled to at least the other one of the two antennas 31, 32. In the embodiment shown in FIG. 3, the receiving module 39 is coupled to the antenna under test 31. It is also possible that the receiving module 39 is coupled to the reference antenna 32. It would also be possible that the receiving module 39 is coupled to both antennas 31, 32.

Further, the antenna measuring station 30 comprises a time-domain filter 36. A filter width of the time-domain filter 36 is determined in dependence on a spatial distance r between the antenna under test 31 and the reference antenna 32. Regarding the spatial distance r and the related direct path, reference is made to the above statements with respect to FIG. 2.

The antenna measuring station 30 comprises a control device 35. The control device 35 is configured to control the transmitting module 38 and the receiving module 39 such that the transmitting module 38 emits a test signal 34a, 34b by means of one of the two antennas 31, 32 and the receiving module 39 receives the test signal 34a, 34b by means of the other one of the two antennas 31, 21. The test signal can comprise test signal portions 34a that are transmitted on the direct path between the two antennas 31, 32, as well as test signal portions 34b that are transmitted on an indirect path between the two antennas 31, 32.

Further, the control device 35 is configured to convert the test signals 34a, 34b received in the frequency domain into the time domain. Additionally, the control device 35 applies the time-domain filter 36 to the received test signal, i.e. the test signal converted into the time domain. Here, the test signal portions lying outside the filter width can be filtered out. The filter width can, for example, be determined such that only the test signal portions 34a transmitted on the direct path can pass the time-domain filter 36, while the test signal portions 34b transmitted on the indirect path are filtered out by the time-domain filter 36.

Additionally, the control device 35 is configured to convert the filtered test signal present in the time domain back to the frequency domain and to determine, from the test signal converted back into the frequency domain, the antenna gain of the antenna under test 31 in dependence on a specific spatial angle by applying Equation (1).

In the following, with reference to FIGS. 4 and 5, the above-described signal propagation times of the test signal will be illustrated.

Figure 4:
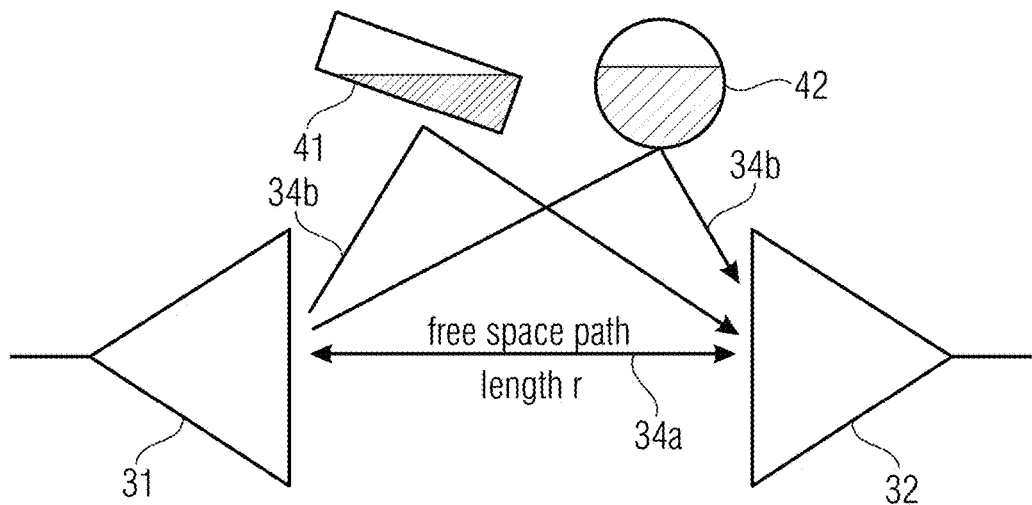
FIG. 4 is a schematic figure for illustrating a signal transmission in the direct path and in indirect paths.

FIG. 4 shows schematically a reference antenna 31 and an antenna under test 32. The test signal comprises both test signal portions 34a that are transmitted via the direct path between the two antennas 31, 32 as well as test signal portions 34b that are transmitted via indirect paths between the two antennas 31, 32. On the indirect paths, the test signal portions 34a are reflected at objects and obstacles 41, 42, respectively, positioned in the surroundings and in the free space, respectively.

Figure 5:
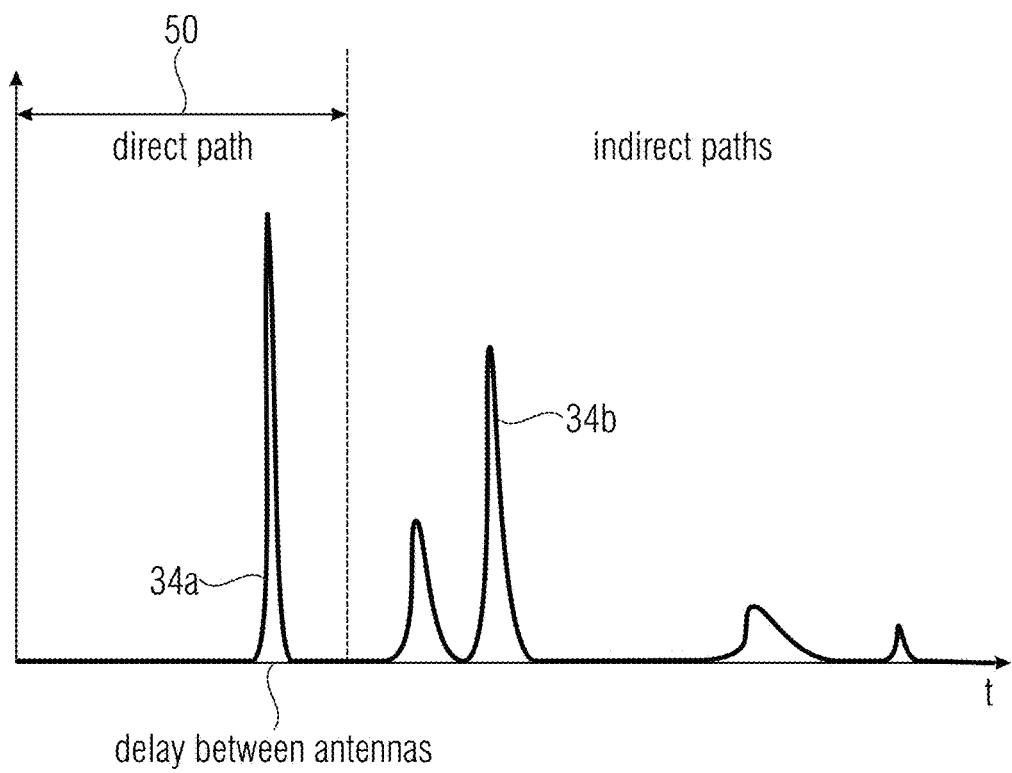
FIG. 5 is a diagram for illustrating the received signal strength over time.

FIG. 5 shows a typical time-domain signal of a measurement with a measurement set up as illustrated in FIG. 4. In the diagram, the amplitude of the measured signal is plotted over time.

Here, it can be clearly seen that the signal portion 34a transmitted on the direct path shows a significantly shorter propagation time than the signal portions 34b transmitted via indirect paths. Since the least attenuation of the signal occurs on the direct path, it is obvious that the signal portion 34a transmitted on the direct path has a greater amplitude compared to the signal portions 34b transmitted on the indirect paths.

According to the invention, the spatial distance r (FIG. 4) is determined between the two antennas 31, 32. Thus, when the wavelength and propagation speed of the time-domain signal, respectively, is known, the propagation time of the signal on the direct path can be determined. A filter width 50 of the time-domain filter 36 can, for example, be adjusted such that only the signal portions 34a transmitted on the direct path can pass the filter 36, while the signal portions 34b transmitted on indirect paths having longer propagation time and smaller amplitude are filtered out by the filter 36. This method is also referred to as time gating.

Thus, in an antenna measuring station, there is one direct path and many indirect paths, as illustrated in FIG. 4. The target of filtering by means of the time-domain filter 36 is a subtraction of indirect paths, so that these signal portions 34b do not interfere with the actual power transmission and the measurement level, depending on the position, does not change due to constructive interferences, respectively. This signal change can also be interpreted as spurious signal.

In conventional technology, the main strategy for reducing spurious signals consists of disposing absorbent material between the antennas and the surroundings. Thereby, the spurious signals are heavily or strongly suppressed (at least 30 dB). The absorbent material has the effect that the measurements can only take place in closed rooms (e.g. anechoic rooms, shielded rooms). By the above-described inventive filtering in the time domain, this limitation can be overcome, i.e. the antennas 31, 32 can also be measured in free space, i.e. outside closed rooms (e.g. anechoic rooms, shielded rooms).

In the time domain, the spurious signal portions 34b can be separated from the signal portions 34a transmitted via the direct path and filtered out. The reason is that the direct path theoretically has the shortest delay and at the same time the greatest amplitude (see FIG. 5).

Thus, the inventive time-domain filter 36 has the effect to separate the direct path from influences of the surroundings. For this, different measures can be taken:

a) ensuring that no reflecting objects 41, 42 are so close to the antennas 31, 32 that indirect and direct paths overlap:
b) determining the direct path delay by determining the spatial distance r of the reference antenna 32 to the antenna under test 31; and
c) determining the bandwidth of antenna type and room characteristics.

After the filter width of the time-domain filter 36 has been determined, the control device 35 converts the filtered signal and the filtered signal portion 34a, respectively, back to the frequency domain.

By considering this filtered signal portion 34a, the control device 35 then determines the antenna gain of the antenna under test 31 by applying Equation (1).

Figure 6:
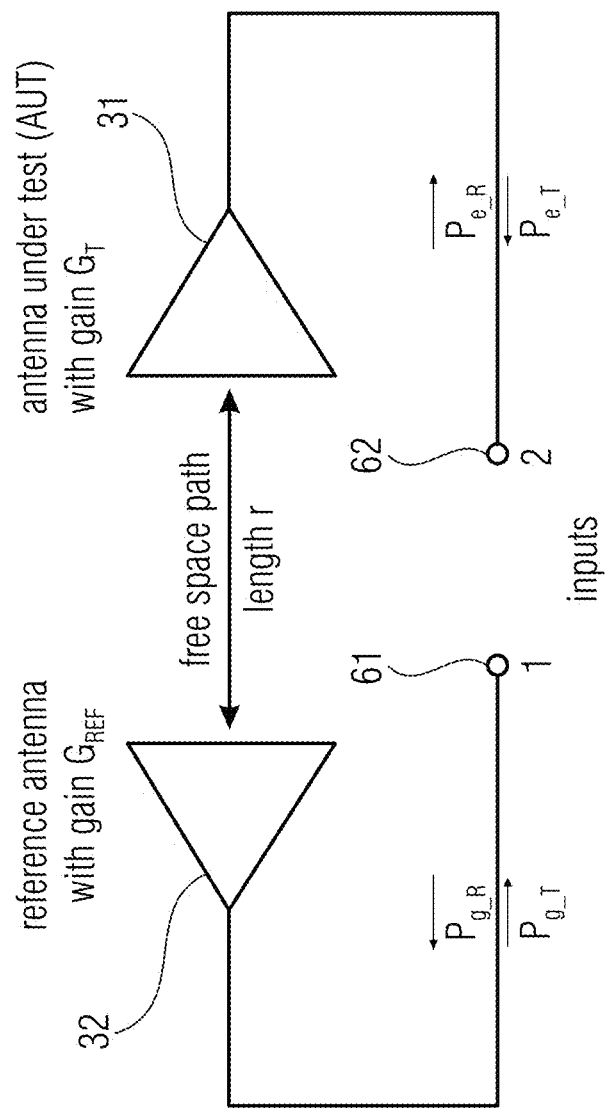
FIG. 6 is a schematic figure for illustrating power flows that can be transmitted between two antennas.

For illustrating Equation (1) for calculating the antenna gain of an antenna under test 31, FIG. 6 shows the different signal powers of a test signal transmitted between a reference antenna 32 and an antenna under test 31. FIG. 6 shows two signal inputs 61, 62. The first signal input 61 can, for example, be coupled to a transmitting module 38. The second signal input 62 can, for example, be coupled to a receiving module 39.

$P_{g\_R}$ designates the power flowing into the reference antenna 32. $P_{g\_T}$ designates the power flowing out of the reference antenna 32. $P_{e\_R}$ designates the power flowing into the antenna under test 31. $P_{e\_T}$ designates the power flowing out of the antenna under test 31.

Figure 7:
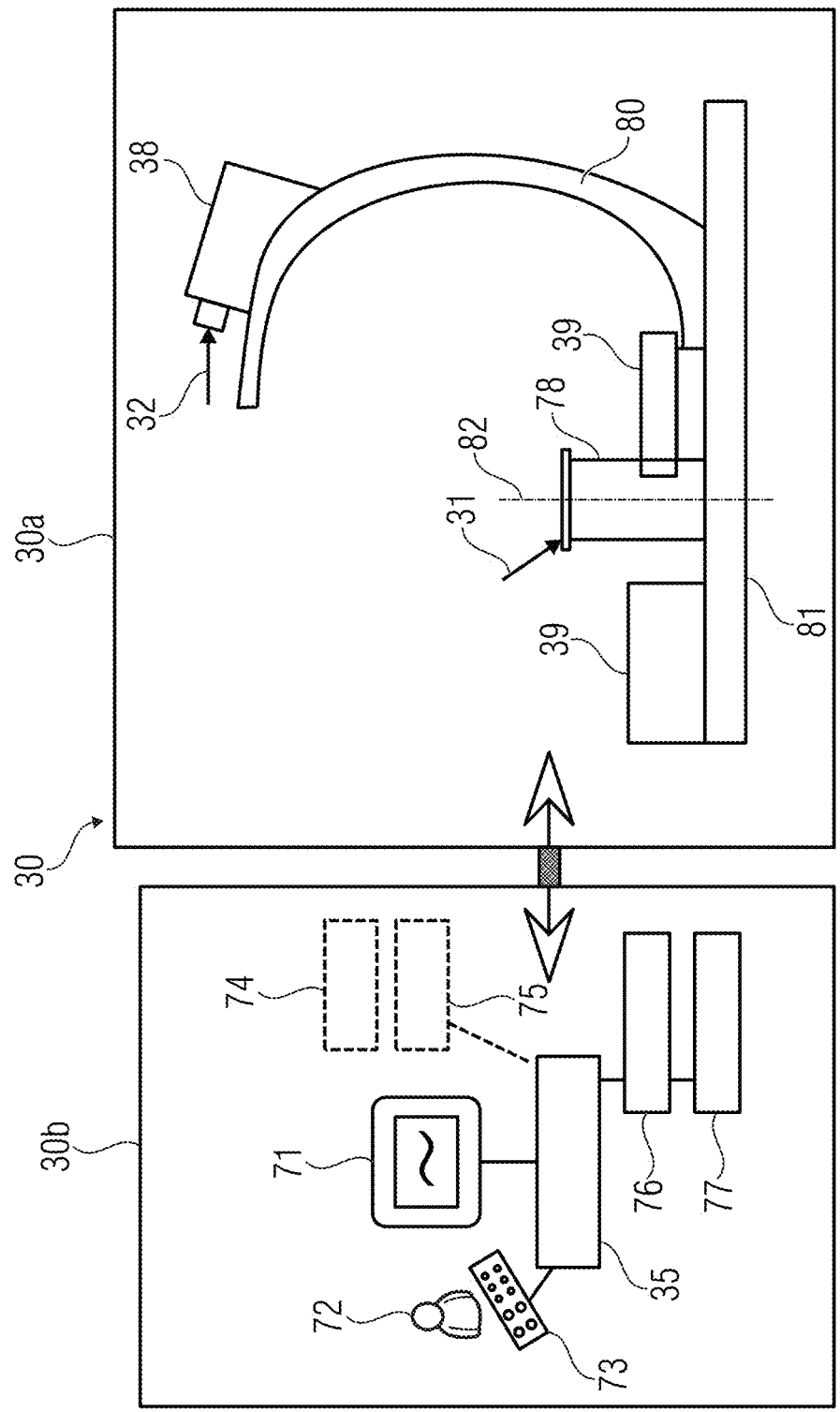
FIG. 7 is an embodiment of an inventive antenna measuring station.

FIG. 7 shows an embodiment of an inventive antenna measuring station 30. The antenna measuring station 30 is divided into an objective antenna measuring station 30a and an automated flow control 30b. As can be seen, the inventive antenna measuring station 30 needs no specific wave shielding, i.e. by means of a shielded room.

The antenna measuring station 30 comprises a centralized control device 35. The control device 35 can comprise an output and display device 71, respectively, in order to indicate the measurement results to a user 72. Further, the control device 35 can comprise an input device 73, e.g. in the form of a keyboard 73, such that a user 72 can make inputs.

An inventive computer program in the form of software stored on a memory medium exists in the control device 35. The software can include flow-control software 74 for performing the inventive method as well as further software 75 for detecting, storing and evaluating the measurement signals.

Further, the control device 35 can comprise electronic components 76 for controlling the transmitting module 38 as well as electronic components for controlling the rotatable table 78. Additionally, the control device 35 can comprise electronic components for controlling the receiving module 39.

The objective antenna measuring station 30a comprises a rotatable table 78. The antenna under test 31 is disposed on this rotatable table 78. The receiving module 39 is coupled to the antenna under test 31.

Additionally, the antenna measuring station 30 comprises a calibration module 9. The same will be described below in more detail with reference to FIG. 11. The rotatable table 78 comprises a connector (e.g. coaxial or hollow conductor) by means of which the calibrating module 79 can be connected.

Further, the antenna measuring station 30 comprises a receiving device 80 for movably receiving the reference antenna 32. The reference antenna 32 is coupled to the transmitting module 38. The transmitting module 39 and the reference antenna 32, respectively, are movable along the receiving device 80. Here, the receiving device 80 is exemplarily configured as an approximately semi-circular arm, so that the transmitting module 39 and the reference antenna 32, respectively, can be moved along this semi-circle by 180° (±90°).

The modules are connected for calibration by means of the above-mentioned calibration unit 79. For calibration, the TRL method is used, which will be discussed in more detail with reference to FIG. 11. The transmitting module 38 with a dual-polarized reference antenna 32 is movably mounted on the receiving device 80 that is rotatable by 180° and advantageously semi-circular.

The rotatable table 78 and the receiving device 80 are disposed together on a vibration-protected table 81.

The antenna under test 31 is disposed on the rotatable table 78 and electrically contacted with the essential terminals. The table 78 is rotatable around its longitudinal axis 82. Advantageously, the table 78 is rotatable continuously and by 360°. As soon as the table 78 rotates, the antenna under test 31 disposed on the same rotates as well. This rotation of the antenna under test 31 around the longitudinal axis 82 of the rotatable table 78 designates a rotation in a first plane. In the above-shown case, the antenna under test 31 rotates around its horizontal plane, wherein the rotation angle is also referred to as azimuth angle $\varphi$.

In contrary to that, the reference antenna 32 performs, during its movement along the receiving device 80, a movement relative to the antenna under test 31 in a second plane perpendicular to the first plane. Thus, this second plane can also be considered as a vertical plane in which the antenna under test 31 is measured. The deflection angle of the reference antenna 32 relative to the antenna under test 31 is thus also referred to as elevation angle $\vartheta$.

By the above-described rotation by 360° of the antenna under test 31 in its horizontal plane, in connection with the described deflection of the reference antenna 32 relative to the antenna under test 31 by ±90° (starting from the horizontal level as zero level), a complete sphere results, which is formed around the antenna under test 31. Thus, the antenna under test 31 can be measured completely, i.e. the radiation and receiving characteristic, respectively, of the antenna under test 31 can be determined in the entire room.

Figure 8:
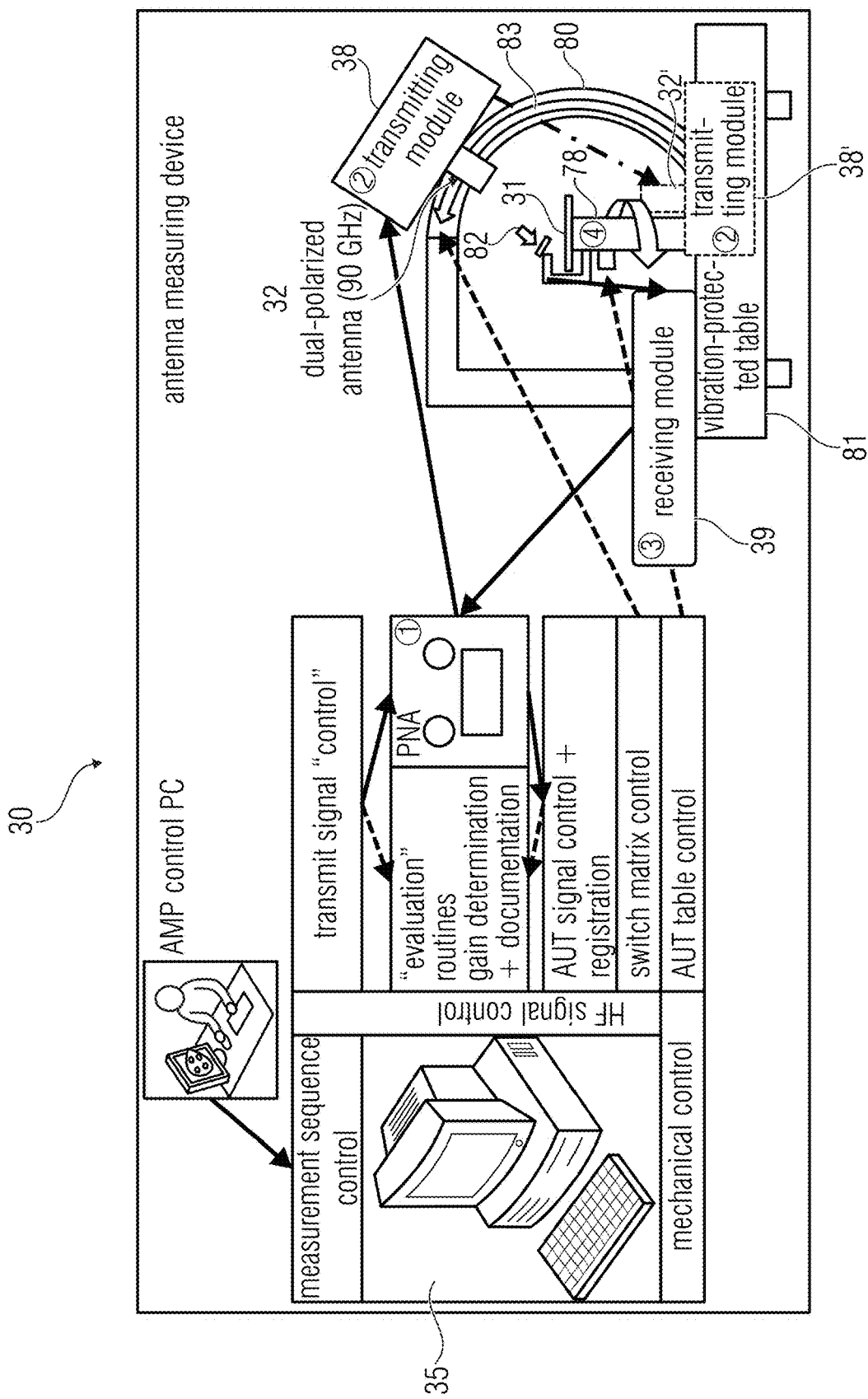
FIG. 8 is a further embodiment of an inventive antenna measuring station.

FIG. 8 shows a more detailed view of the above-described antenna measuring station 30. The same features as in FIG. 7 are provided with the same reference numbers in FIG. 8, which is why reference is made to the above paragraphs for discussing the same.

However, FIG. 8 shows more clearly how the reference antenna 32 is movable along the receiving device 80. The reference antenna 32 can be moved in the arrow direction 83 along the semi-circular receiving device 80. Exemplarily, a lower position of the reference antenna 32 is drawn in dotted lines in FIG. 8. The lower position is indicated by reference numeral 32' for the reference antenna and by reference numeral 38' for the transmitting module.

The reference antenna 32 is movable by ±90° with respect to the horizontal plane of the antenna under test 31, such that a semi-circle results around the antenna under test 31. Thus, when the antenna under test 31 rotates, as above-described, by means of the rotatable table 78 in its horizontal plane and at the same time the reference antenna 32 is moved along the semi-circular receiving device, a complete sphere can be formed around the entire antenna under test 31.

The antenna under test 31 can be operated both in the transmitting mode and in the receiving mode. In the exemplary embodiments shown in the figures, the reference antenna 32 is operated in the transmitting mode and the antenna under test 31 is operated in the receiving mode. For this, the reference antenna 32 is coupled to a transmitting module 38 and the antenna under test 31 is coupled to a receiving module 39.

It would also be possible that the antenna under test 31 is operated in a transmitting mode and the reference antenna 32 in the receiving mode. In this case, the reference antenna 32 would be coupled to a receiving module 39 and the antenna under test 31 would be coupled to a transmitting module 38. It would also be possible that both antennas 31, 32 would be coupled to an individual or common transmitting and receiving module.

Figure 9A:
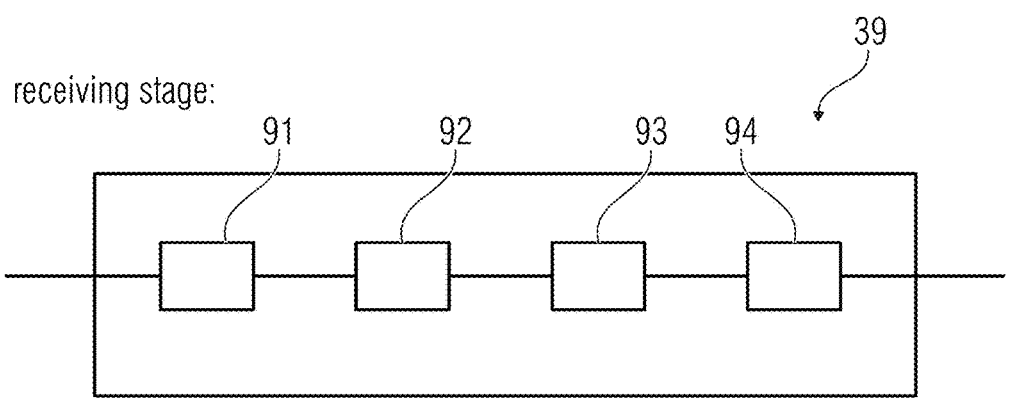
FIG. 9A is a block diagram of a receiving stage.
Figure 9B:
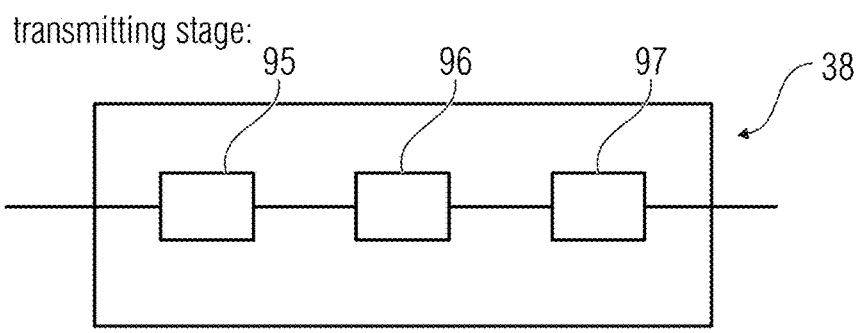
FIG. 9B is a block diagram of a transmitting stage.

FIG. 9A shows a schematic block diagram of an exemplary receiving module 39 and FIG. 9B shows a schematic block diagram of an exemplary transmitting module 38.

As shown in FIG. 9A, the receiving module includes, according to the invention, a receiving stage with ultrabroadband receiving antenna 91 (dual, linear polarized), a switching matrix 92, an amplifier 93 and a mixer 94 arranged in signal direction.

As shown in FIG. 9B, the transmitting module includes a transmitting stage with a mixer 95, an amplifier 96 and a switching matrix 97 arranged in signal direction.

The receiving/transmitting modules 38, 39 are adaptable/ exchangeable to the respective frequency bands. Here, one transmitting signal each is mixed up/mixed down, e.g. from 20 GHz and amplified by the amplifier at the input of the receiving/transmitting modules 38, 39. The high frequencies are now present in the transmitting/receiving modules and are forwarded to the individual areas.

The transmitting module 38 consists of different components optimized specifically for the inventive antenna measuring station 30. Compared to known systems, the inventive transmitting module 38 comprises only one transmitting stage. By that step it is possible to design the structure in a compact and at the same time powerful manner. Additionally, the transmitting stage is integrated in the transmitting module 38 for one or even several frequency systems so that the transmitting module 38 does not have to be changed when changing the frequency domain.

Figure 10:
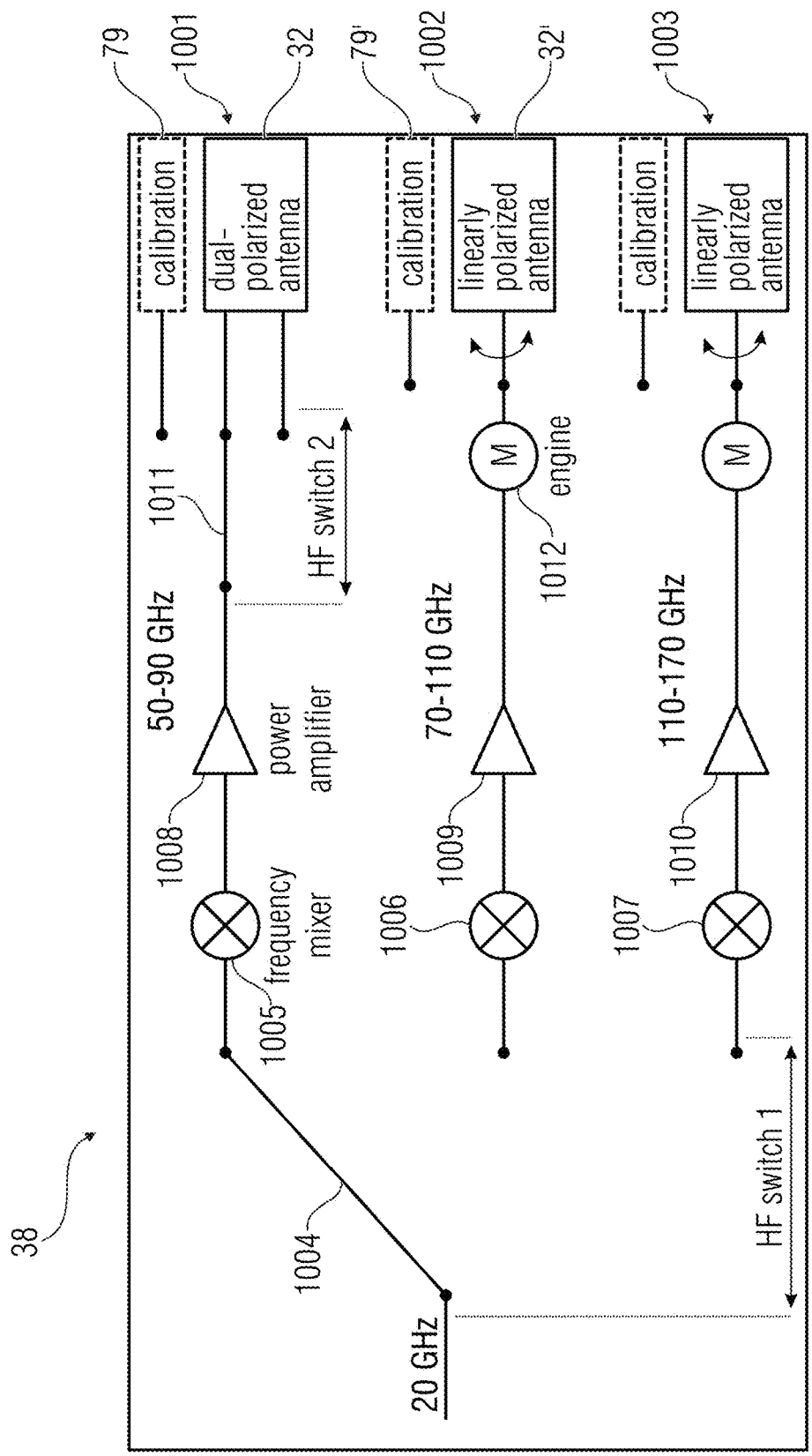
FIG. 10 is a detailed block diagram of an exemplary transmitting stage.

FIG. 10 shows an exemplary set-up of an inventive transmitting module 38 having three transmitting stages 1001, 1002, 1003. The transmitting stages 1001, 1002, 1003 are fed by signals generated by a signal generator (e.g. high-frequency measuring device) (e.g. up to 26.5 GHz). The individual transmitting stages 1001, 1002, 1003 can be selectively controlled via an electrical or mechanical switch 1004.

As described above with reference to FIG. 9B, each transmitting stage 1001, 1002, 1003 comprises one frequency mixer 1005, 1006, 1007 and one signal amplifier 1008, 1009, 1010. By means of the respective mixer 1005, 1006, 1007, the frequency of the fed-in signal is mixed up to the respective high-frequency band and amplified via the respective power amplifier 1008, 1009, 1010. The power is passed on to a mechanical and electrical switch 1011, respectively, that forwards the HF power selectively to the transmitting antenna (reference antenna 32 and antenna under test 31, respectively) or to the electric calibration module 79.

The receiving module 39 is structured in a similar manner as the transmitting module 38. The difference is that only a one-to-two switch is needed between the antenna under test 31 and the calibration unit 79.

The switch 1011 is particularly advantageous when the respective antenna 31, 32 is a dual-polarized antenna. In the sense of the present disclosure, the switch 1011 is also referred to as switching matrix and essentially corresponds to the switching matrix 97 shown schematically in FIG. 9B.

The inventive application of such a dual-polarized antenna 31, 32 in an inventive antenna measuring station 30 is clearly advantageous compared to conventional technology. By the application of horn antennas known in conventional technology that are typically used as reference standard, both polarizations have to be measured. Thereby, typically, the entire sphere is measured with the first polarization and subsequently with the second polarization. This is very time-consuming and expensive.

Known dual-polarized horn antennas ([6]-[10]) are broadband and usually operate in frequency ranges below 60 GHz. In order to increase the measurement efficiency of the inventive antenna measuring station, 30, dual-polarized antennas are advantageous for frequencies between 50 GHs and 100 GHs, which can either be configured as planar, horn or helix antenna.

The usage of a dual-polarized antenna as reference antenna 32 is hence clearly advantageous and results in significant time and cost savings. With anewed reference to FIG. 10, the dual-polarized antenna 32, whose polarization can be switched by means of the switch 1001, will be discussed in more detail again.

Thus, when measuring an antenna under test 31, an (upmixed) test signal is emitted by means of the reference antenna 32 in a specific position of the antenna under test 31 relative to the reference antenna 32. Here, the switch position of the switch 1011 is selected such that the reference antenna 32 has a first polarization direction. Subsequently, the switch 1011 can be switched, such that the reference antenna 32 comprises a second polarization direction, wherein this second polarization direction is offset by 90° to the first polarization direction.

Instead of such a dual-polarized antenna, linearly polarized antennas 32' can be used as well. Then, according to the invention, an engine 1012 can be used to rotate to linearly polarized antenna 32' by 90°. Here, also, a switch can still be provided in order to switch between the linearly polarized antenna 32' and the calibration module 79'.

Figure 11:
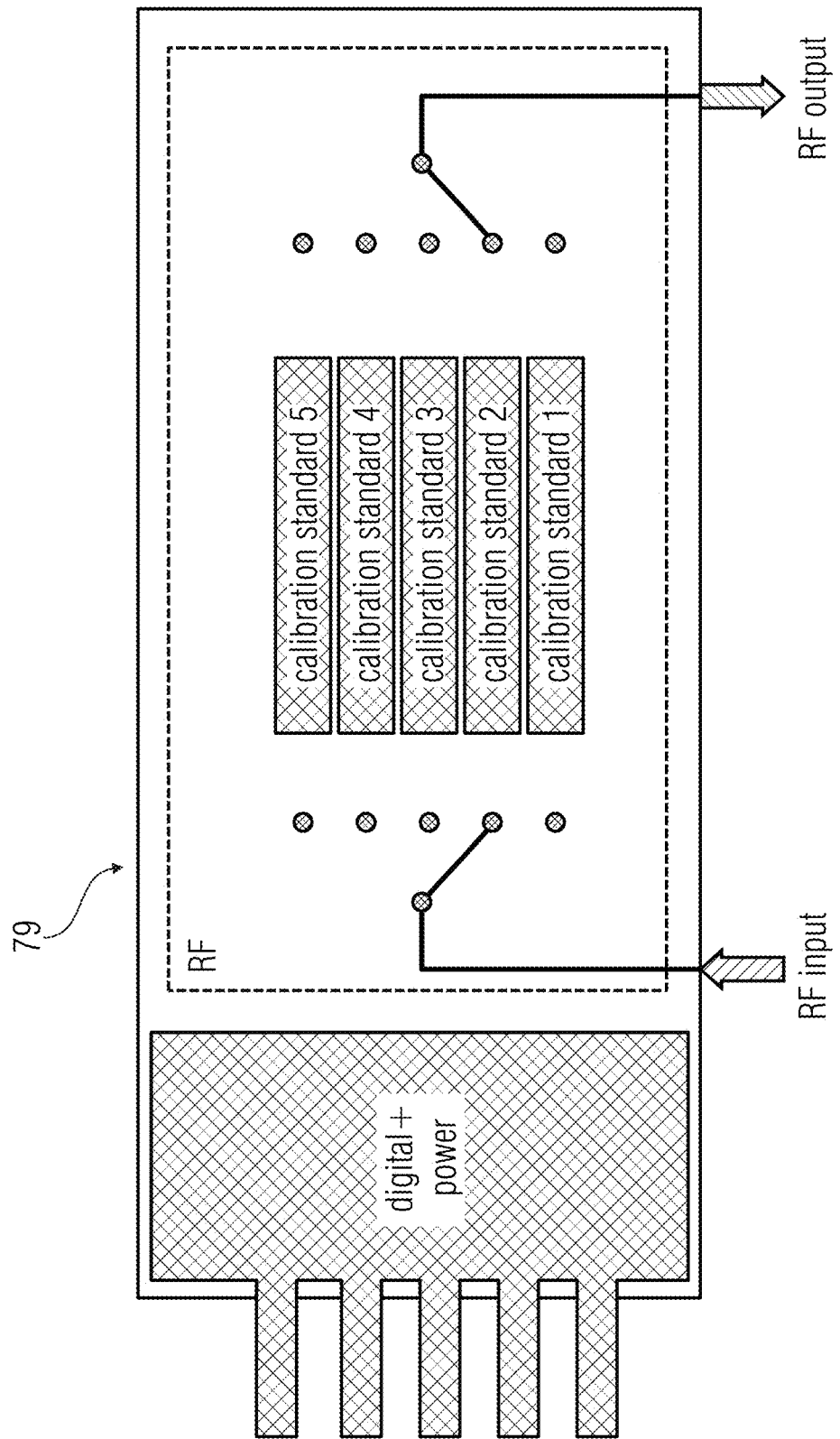
FIG. 11 is a block diagram of an eCal calibration module.

The above-mentioned calibration module 79 can, for example, be a so-called eCal module. FIG. 11 shows an example of a calibration module 79 as it can be used in an inventive antenna measuring station 30.

The calibration module 79 consists of a control range and power as well as a high-frequency range (RF). The calibration can be implemented, for example with the so-called multiline TRL [11] that has been developed by Marks in the 90s. Here, calibration needs different standards (exactly defined HF structures). Here, TRL stands for Thru (direct connection between the two ports; reflection (short-circuit or idle)) as well as different line lengths. By an electrical and mechanical switch, respectively, switching is performed during calibration. The actual calibration procedure takes either place in the measurement device or in the control PC.

Figure 13:
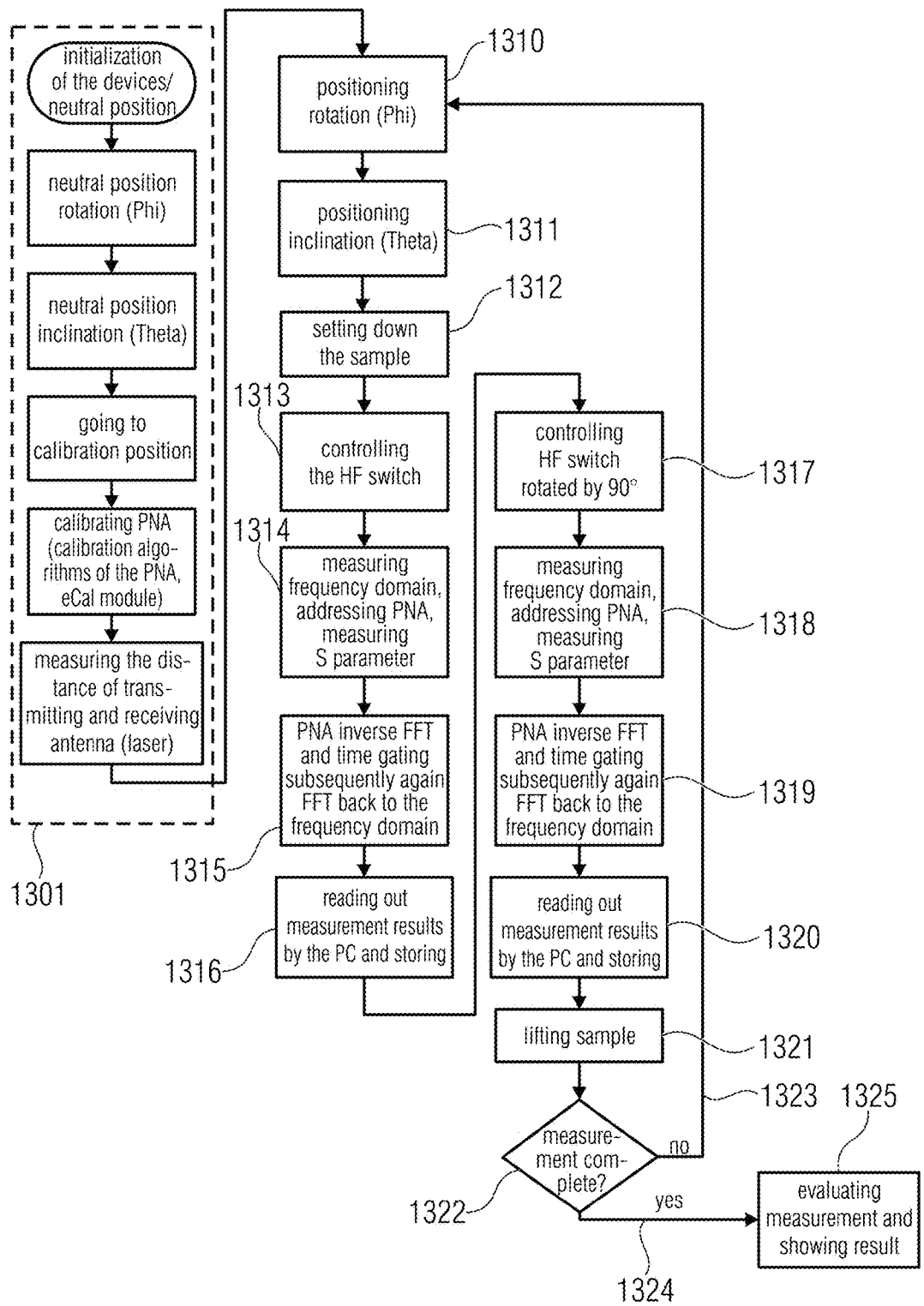
FIG. 13 is a flow diagram of a further example of an inventive method.
Figure 14:
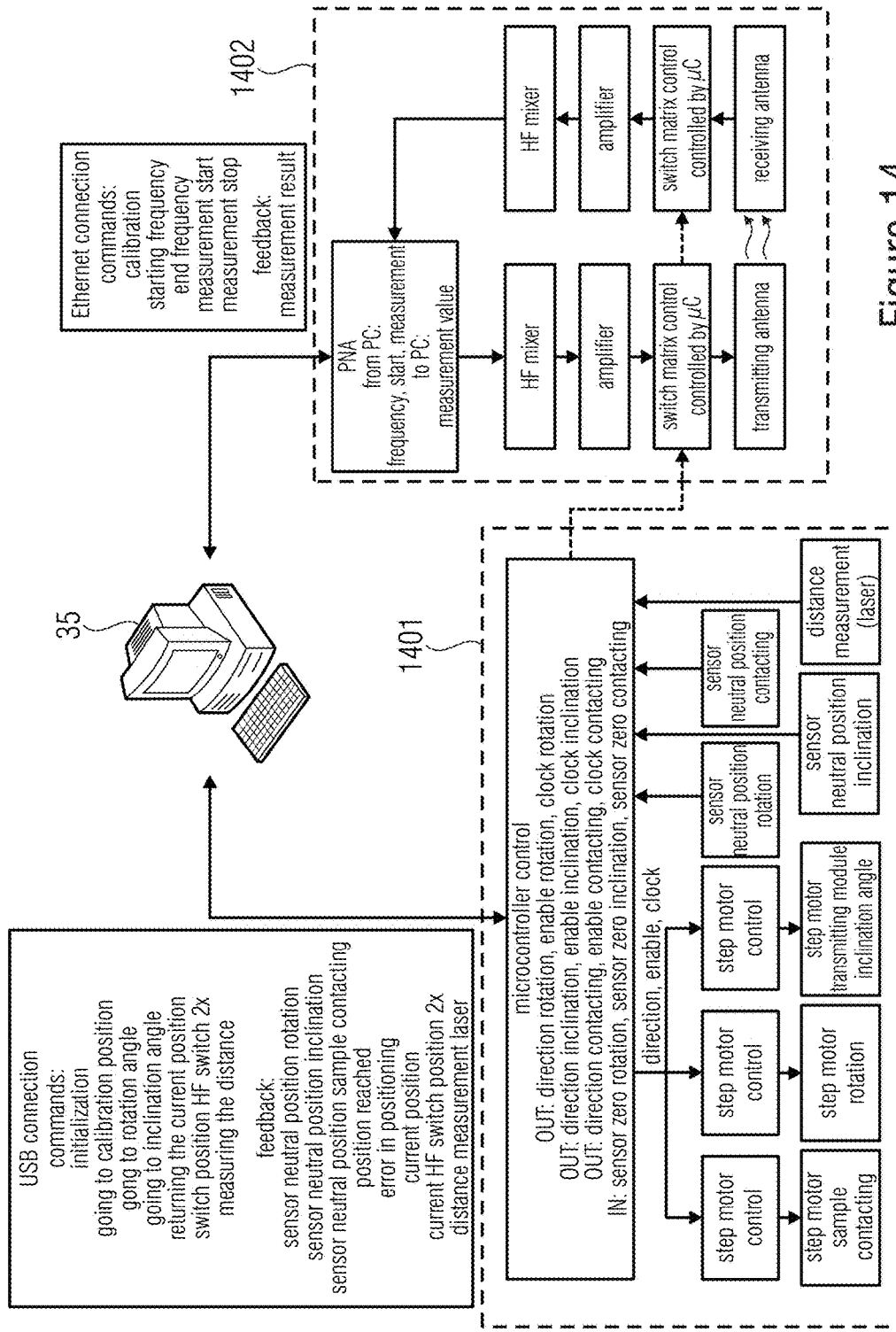
FIG. 14 is a block diagram for illustrating the apparatus components in connection with the method steps.
Figure 15:
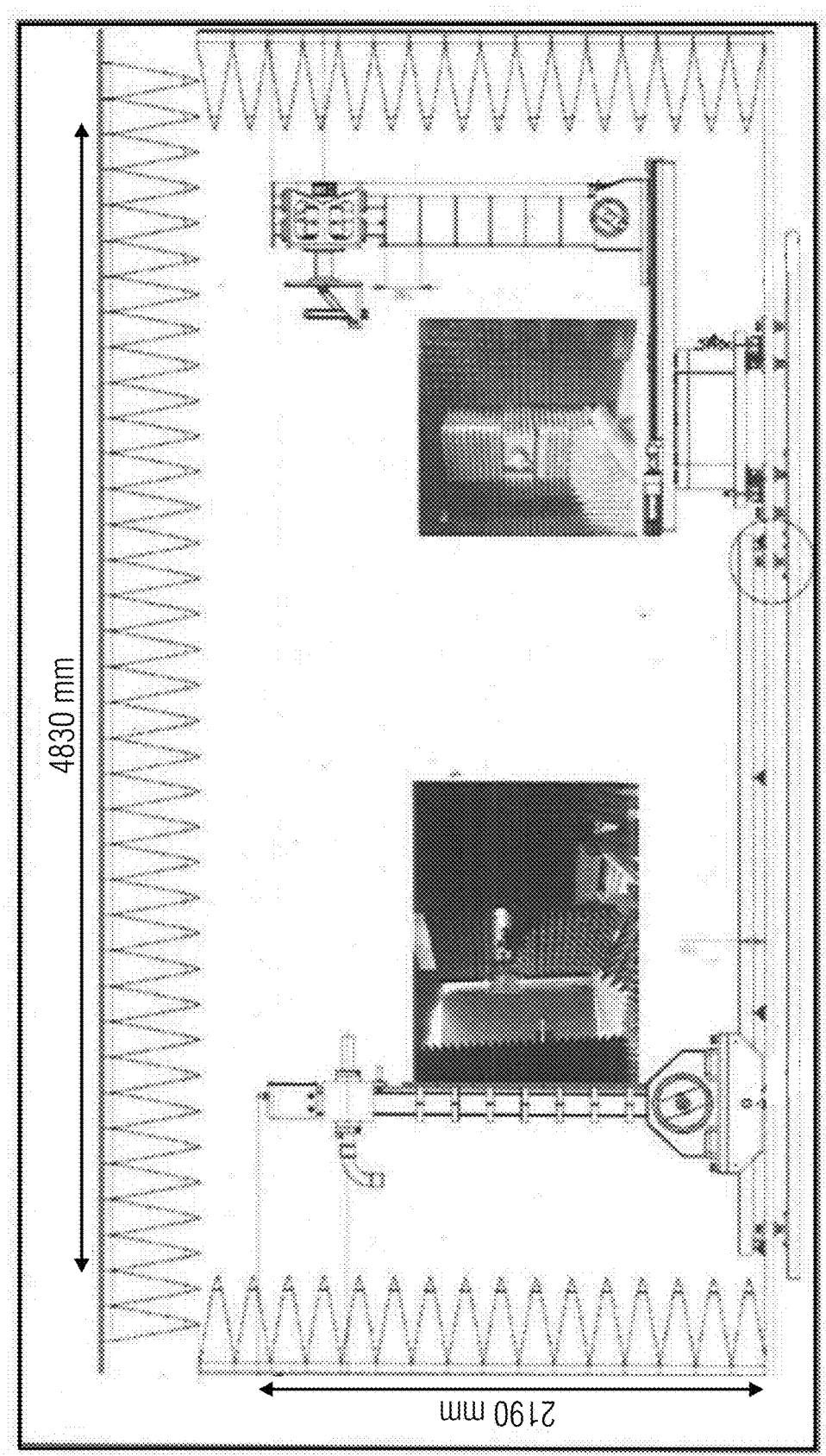
FIG. 15 is a conventional shielded room of conventional technology.

After having described the structural features of the inventive apparatuses 20, 30 in detail, the mode of operation of these apparatuses will be discussed in more detail below with reference to FIGS. 12 to 14.

Figure 12:
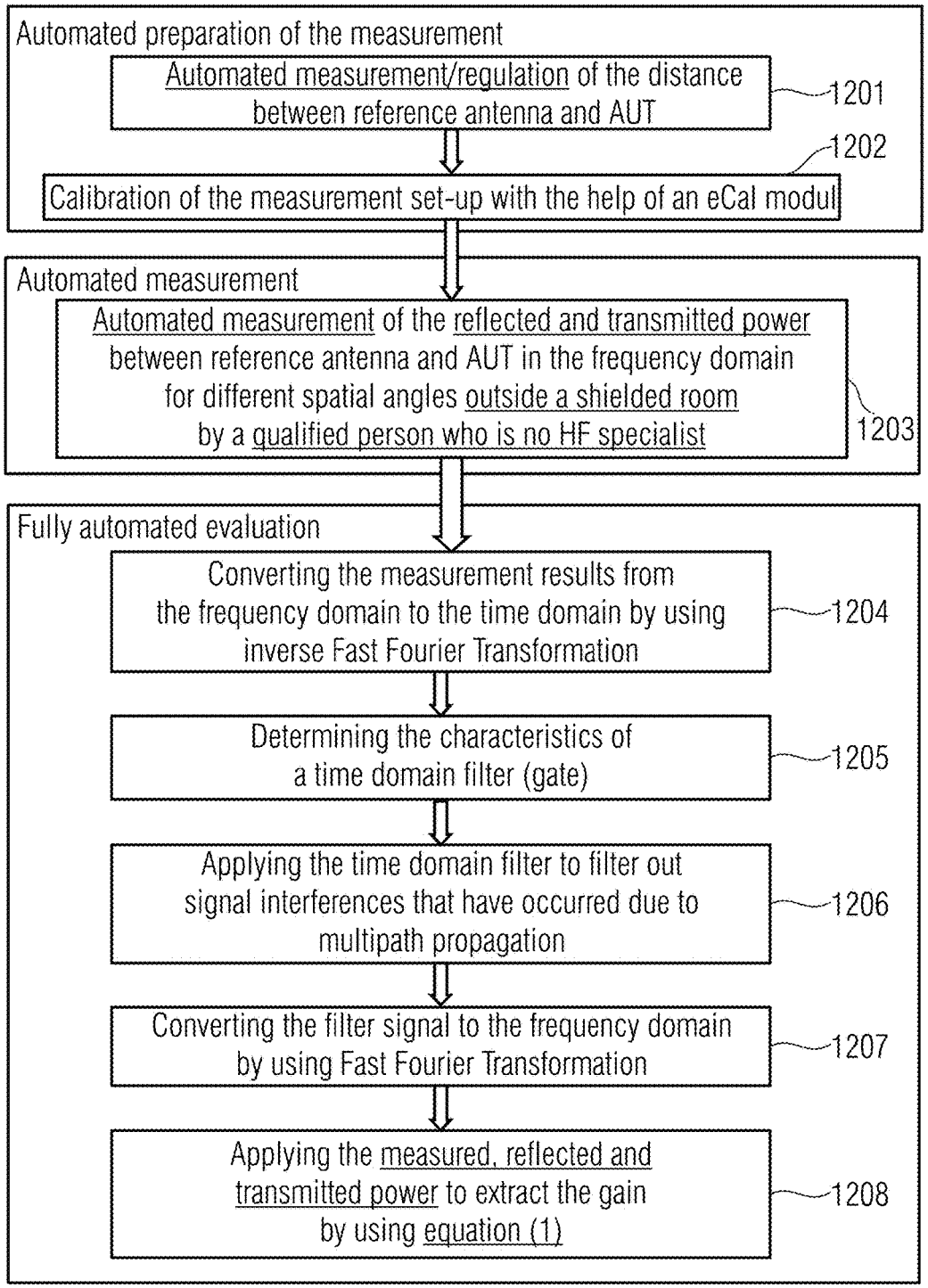
FIG. 12 is a block diagram of an example of an inventive method.

First, FIG. 12 describes an example how the inventive method can be performed by means of an inventive apparatus 20 and with an inventive antenna measuring station 30, respectively.

Automated control of the measuring station and the measuring devices takes place via a centralized computer. In a first step (block 1201), the antenna under test 31 (AUT) is placed into the measurement set-up, here, the distance between the antenna under test 31 and the reference antenna 32 as well as their orientation to one another is automatically detected and stored. This can be realized, for example, with a laser measuring device. The same measures the distance and also the angle between both antennas 31, 32.

An inclination of the reference antenna 32 can be prevented in that the same is fixed at the receiving device 80 normal to the surface. Subsequently, the electric influences of the cable and the measurement device tolerances on the two antennas are calibrated by an easy-to-operate electric calibration module (eCal) 79 (block 1202).

The automated measurement, for which no expert knowledge in high-frequency measurements technology is needed, can be started via an intuitively operable graphical user interface (GUI of the central computer), (block 1203). By means of the GUI, the frequency domain and the spatial domain can be detected. The horizontal plane can be covered from −180° to +180° and the vertical plane can be covered from −90° up to approximately +90°. The respective spatial angle is obtained by electronic control of the system.

The reference antenna 32 can be a dual-polarized antenna mounted on the receiving device 80. Compared to a linearly polarized horn antenna, the dual-polarized antenna does not have to be mechanically rotated, but by means of the electronic switch 1011 (FIG. 10), the second polarization (perpendicular to the first) of the antenna can be used for the measurement.

The resulting measurement results are then converted from the frequency domain to the time-domain by means of inverse Fast Fourier transformation (iFFT). The conversion is prompted by the central control device 35 (block 1204).

The software 74,75 automatically refers to the stored distance r between the antenna under test 31 and the reference antenna 32 and calculates the width of the time-domain filter 36 (block 1205). The filter width is selected such that the influences of multipath propagation caused by undesired reflections at surrounding objects are also considered. Thereby, no shielded room is needed for the measurement, which significantly eases the measurement set-up.

Then, the filter 36 is applied to the obtained time-domain measurement (block 1206) in order to filter out the spurious multipath reflections.

By means of Fast Fourier Transformation (FFT), the signal is subsequently converted back to the frequency domain (block 1207). The obtained result is the transmitted and reflected power, filtered from undesired signal interferences (multipath propagation/reflection), in dependence on the spatial angle, i.e. the position in space.

Based thereon, the operation software calculates the antenna gain $G_T(\vartheta,\varphi)$ by applying Equation (1), in dependence on the spatial angle and by considering reflection and polarization losses (block 1208).

$$G_T(\vartheta, \varphi) = 10\log_{10}\left(\frac{P_{e\_T}}{P_{g\_R}}\right) - 20\log_{10}\left(\frac{\lambda}{4\pi r}\right) -$$

$$G_{REF}(\vartheta, \varphi) - \left(10\log\left(1 - \left(\frac{P_{e\_T}}{P_{e\_R}}\right)\right|_{P_{g\_R}=0}\right) +$$

$$10\log\left(1 - \left(\frac{P_{g\_T}}{P_{g\_R}}\right)\right|_{P_{e\_R}=0}\right) + 20\log|\hat{p}_R \cdot \hat{p}_T|$$

Equation (1)

Both effects, i.e. reflection and polarization losses, will be discussed below with reference to Equation (1).

At the transition of the respective cable to the respective antenna, reflections occur, since discontinuity exists between the characteristic impedance of cable and antenna. This effect is considered in the above Equation (1) by the two terms $$10\log\left(\frac{P_{e\_T}}{P_{e\_R}}\right)\bigg|_{P_{gR}=0}$$

(antenna under test) and $$10\log\left(\frac{P_{g\_T}}{P_{g\_R}}\right)\bigg|_{P_{eR}=0}$$

(reference antenna). $P_{g\_R}$ designates the power of a signal flowing into the reference antenna 32 (see also FIG. 6), $P_{g\_T}$ designates the power of a signal flowing out of the reference antenna 32, $P_{e\_R}$ designates the power of a signal flowing into the antenna under test 31 and $P_{e\_T}$ designates the power of a signal flowing out of the antenna under test 31.

Polarization losses occur in that an angle exists between the unit vector of the electric field vector of the antenna under test ($\hat{p}_T$) and the one of the reference antenna ($\hat{p}_R$) axis. The polarization losses are normally performed by measuring both polarizations of a linearly polarized horn antenna. For this, the antenna has to be mechanically rotated by 90°. By applying a dual-polarized antenna, by means of an HF switch 1011 (FIG. 10), both polarizations can be detected significantly faster.

Thus, Equation (1) describes the complete formula for inventive gain calculation of an antenna under test 31, which the operation software can perform and store in the background. The resulting overall result is the spatial radiation (gain) of the antenna under test 31 by considering and extracting undesired multipath signal interferences with the help of an intuitive software surface and an automatically controlled antenna measuring station.

This results in significant advantages with respect to conventional technology:
- no shielded room is needed,
- automated measurement sequence,
- no highly-qualified personnel is needed for operation
- higher measurement accuracy
- lower investment costs for the antenna measuring station FIG. 13 describes again a more detailed sequence of a measurement as can be performed with an antenna measuring station 30 illustrated in FIG. 8. The dotted-line box 1301 includes several blocks that can be performed once prior to performing a test sequence.

In a first step, the devices are initialized and brought into neutral position. For that, the rotatable table 78 is moved to a neutral position such that the antenna under test 31 disposed thereon is in a neutral position with regards to its rotation φ in its horizontal plane.

The reference antenna 32 is also moved along the receiving device 80 to its neutral position with regard to its inclination ϑ relative to the antenna under test 31. This neutral position can either be parallel to the horizontal plane of the antenna under test 31 or perpendicular thereto.

Subsequently, the devices are calibrated by means of the calibration module 79. Before or after that, the spatial distance r as well as the relative orientation of the two antennas 31, 32 to one another is measured by means of a laser measuring device.

Subsequently, the test sequence for determining the antenna characteristic of the antenna under test can be performed. In block 1310, the antenna under test 31 is first brought to a specific position (first azimuth measuring position) with regard to its rotation φ. This takes place by means of rotating the rotatable table 78.

In block 1311, the reference antenna 32 is brought to a specific position (first elevation measuring position) relative to the antenna under test 31. This takes place by means of methods of the reference antenna 32 along the receiving device 80.

Steps 1310 and 1311 can also be performed in reverse order.

In block 1312, the antenna under test 31 is contacted. This can take place, for example, by means of a probe.

In block 1313, the HF switch 1011 of the receiving module 39 coupled to the antenna under test 31 is controlled in order to switch from the calibration position to the receiving position, such that the receiving module 39 can receive the signal emitted by the reference antenna 32 by means of the antenna under test 31. By means of the HF switch 1011 in the transmitting module 38 coupled to the reference antenna 32, switching to a first polarization of the reference antenna 32 takes place.

In block 1314, the received signal is measured in the frequency domain. In block 1315, this signal is transformed to the time domain by means of inverse FFT and the above-described time gating is applied to the signal. Subsequently, transformation back to the frequency domain is performed by means of FFT.

In block 1316, the measurement results of the filtered signal are read out and the antenna gain can be determined by applying Equation (1) in dependence on the currently adjusted spatial angle. The results can be stored in the control device and can be displayed to the operator by means of a suitable display device.

In block 1317, the HF switch 1011 of the transmitting module 38 coupled to the reference antenna 32 is switched to a second polarization that is offset by 90° to the first polarization.

Then, in block 1318, the signal is measured again, analogously to block 1314. Then, in block 1319, analogous to block 1315, time gating is applied to the signal.

Then, in block 1320, analogously to block 1316, the measurement values of the filtered signal are read out and stored and the antenna gain can be determined by applying Equation (1) in dependence on the currently adjusted spatial angle.

In the query block 1322 it is then decided whether the measurement is complete or whether further measurements are to be performed. If the measurement is not yet complete, return to block 1310 via transition 1323 takes place. Here, a new position of the antenna under test 31 relative to the reference antenna 32 is taken up and a further measurement process is performed. This loop can be repeated until a complete sphere around the antenna under test 31 has been scanned and measured, advantageously in both polarizations of the reference antenna 32.

When this loop is terminated, in query block 1322 the process proceeds to block 1325 via transition 1324. Here, the measurement results are evaluated and graphically displayed to the operator if needed.

In summary, FIG. 14 shows again a block diagram with some elements of the inventive apparatus. The blocks are denoted with individual steps relating to the inventive method.

In block 1401, the hardware around the antenna measuring station 30 is controlled by means of a microcontroller. In block 1401, for example, the rotatable table 78, the receiving device 80, the probe for antenna contacting and the laser measuring device are controlled. Sensors can provide respective feedback.

In block 1402, the transmitting and receiving modules are controlled in order to transmit and receive, respectively, signals (e.g. a test signal) via the respectively coupled antenna 31, 32.

The central control device 35 coordinates and controls the sequences and evaluates the measurement results.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus. Some or all of the method steps can be performed by a hardware apparatus (or by using a hardware apparatus), such as a microprocessor, a programmable computer or an electronic circuit. In some embodiments, some or several of the most important method steps can be performed by such an apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer readable.

Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, wherein the computer program is stored on a machine readable carrier. In other words, an embodiment of the inventive method is, therefore, a computer program comprising a program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention includes an apparatus or a system that is configured to transmit a computer program for performing at least one of the methods described herein to a receiver. The transmission can, for example, be electronical or optical.

The receiver can, for example, be a computer, a mobile device, a memory device or a similar apparatus. The apparatus or the system can, for example, include a file server for transmitting the computer program to the receiver.

In some embodiments, a programmable logic device (for example a field programmable gate array, FPGA) may be used to perform some or all of the functionalities of the methods described herein. In some embodiments, a field programmable gate array may cooperate with a microprocessor in order to perform one of the methods described herein. Generally, the methods are performed by any hardware apparatus. This can be a universally applicable hardware, such as a computer processor (CPU) or hardware specific for the method, such as ASIC.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] S. Ranvier, M. Kyro, C. Icheln und C. Luxey, "COMPACT 3-D ON-WAFER RADIATION", in MICROWAVE AND OPTICAL TECHNOLOGY LETTERS, 2008
[2] J. Akkermans, R. v. Dijk und M. Herben, "Millimeter-wave antenna measurement", in Proceedings of the 37th European Microwave Conference, Munich, 2007
[3] H. Gulan, S. Beer, S. Diebold, C. Rusch, A. Leuther, I. Kallfass und T. Zwick, "Probe based antenna measurements up to 325 GHz for upcoming millimeter-wave applications", in International Workshop on in Antenna Technology (iWAT), 2013.
[4] T. Zwick, C. Baks, U. R. Pfeiffer, D. Liu und B. P. Gaucher, "Probe Based MMW Antenna Measurement Setup", in IEEE Antennas and Propagation Society International Symposium, 2004.
[5] S. Beer, G. Adamiuk und T. Zwick, "Design and Probe Based Measurement of 77 GHz", in Proceedings of the 39th European Microwave Conference, Roma, 2009.
[6] "A-Info," [Online]. Available: http://www.ainfoinc.com/en/p_ant_h_dual.asp. [access on Oct. 8, 2015].
[7] http://www.ets-lindgren.com/pdf/3115-PA.pdf, "ETS-Lindgren," [Online]. Available: http://www.ets-lindgren.com/pdf/3115-PA.pdf. [access on Oct. 8, 2015].
[8] "exelisinc," [Online]. Available: http://www.exelisinc.com/capabilities/Antennas/Documents/AS-48461_Series.pdf. [access on Oct. 8, 2015].
[9] J. Edwards, R. O'Brient, A. Lee und G. Rebeiz, "Dual-Polarized Sinuous Antennas on Extended Hemispherical Silicon Lenses," in IEEE Transactions on in Antennas and Propagation, 2012.
[10] G. Adamiuk, T. Zwick and W. Wiesbeck, "Compact, Dual-Polarized UWB-Antenna, Embedded," in IEEE Transactions on Antennas and Propagation, 2010.
[11] Roger B. Marks: "A Multiline Method of Network Analyzer Calibration", IEEE TRANSACTIONS ON MICROWAVE THEORY AND TECHNIQUES, VOL. 39, NO. 7, JULY 1991
[12] R. V. De Jough, M. Hajian and L. P. Ligthart, "Antenna time-domain measurement techniques," in *IEEE Antennas and Propagation Magazine*, vol. 39, no, 5, pp. 7-11, October 1997.

The invention claimed is:

1. An apparatus for determining an antenna characteristic of an antenna under test in free space, the apparatus comprising:
a detector for detecting measurement results of a transmitted power of a measurement signal transmitted between a reference antenna and an antenna under test, wherein detecting takes place in the frequency domain;
a control device that is configured to convert the measurement results into the time domain; and
a time-domain filter, wherein the control device is configured to apply the time-domain filter to the measurement results converted into the time domain, wherein a filter width of the time-domain filter is determined in dependence on a spatial distance between the reference antenna and the antenna under test, such that measurement result portions resulting due to multipath propagation of the measurement signal between the reference antenna and the antenna under test are reduced or removed;
wherein the control device is further configured to convert the filtered measurement results into the frequency domain; and
wherein the control device is further configured to determine the antenna gain $G_T(\vartheta, \varphi)$ of the antenna under test based on the filtered measurement results present in the frequency domain by applying the following equation:

$$G_T(\vartheta, \varphi) = 10\log_{10}\left(\frac{P_{e\_T}}{P_{g\_R}}\right) - 20\log_{10}\left(\frac{\lambda}{4\pi r}\right) - G_{REF}(\vartheta, \varphi) - \left(10\log\left(1 - \left(\frac{P_{e\_T}}{P_{e\_R}}\right)\bigg|_{P_{g\_R}=0}\right) + 10\log\left(1 - \left(\frac{P_{g\_T}}{P_{g\_R}}\right)\bigg|_{P_{e\_R}=0}\right) + 20\log|\hat{p}_R \cdot \hat{p}_T|\right).$$

2. The apparatus according to claim 1, wherein the apparatus comprises a moving device for moving the reference antenna relative to the antenna under test to different measurement positions, and wherein the control device is configured to detect, in the different measurement positions, a power of a measurement signal transmitted via a free-space path at a frequency f and the spatial distance between the reference antenna and the antenna under test in the frequency domain for different spatial angles with elevation angle $\vartheta$ and azimuth angle $\varphi$.

3. The apparatus according to claim 1, wherein the detector for detecting measurement results is configured to determine
an input reflection factor $$\left(\frac{P_{e\_T}}{P_{e\_R}}\right)\bigg|_{P_{g\_R}=0}$$

of the antenna under test and
an input reflection factor $$\left(\frac{P_{g\_T}}{P_{g\_R}}\right)\bigg|_{P_{e\_R}=0}$$

of the reference antenna;
and wherein the control device is configured to determine the antenna gain $G_T(\vartheta, \varphi)$ of the antenna under test.

4. The apparatus according to claim 1, wherein the detector for detecting measurement results is configured to:

a) detect the measurement signal power $P_{g\_R}$ flowing into the reference antenna and the measurement signal power $P_{e\_T}$ flowing out of the antenna under test for different spatial angles and b) detect polarization losses based on an angle between the unit vector of the electric field vector of the antenna under test and the electric field vector of the reference antenna; and wherein the control device is configured to determine the antenna gain $G_T(\vartheta, \varphi)$ of the antenna under test.

5. The apparatus according to claim 1, wherein the detector for detecting measurement results further comprises a transmitting module with a transmitting stage that comprises, in signal direction, a mixer, an amplifier and a switching matrix.

6. The apparatus according to claim 1, wherein the detector for detecting measurement results comprises a receiving stage that comprises, in signal direction, a receiving antenna, a switching matrix, an amplifier and a mixer.

7. The apparatus according to claim 5, wherein the control device is configured to control the transmitting stage and/or the receiving stage such that the polarization of the transmitting stage is rotated by 90° relative to the receiving stage, wherein the rotation takes place by controlling the switching matrix of the transmitting stage and/or the receiving stage.

8. An antenna measuring station for determining an antenna characteristic of an antenna under test in free space, the antenna measuring station comprising:

an antenna measuring device with a transmitting module and a receiving module, an antenna under test and a reference antenna, wherein the transmitting module is coupled to at least one of the two antennas and the receiving module is coupled to at least the other one of the two antennas, a time-domain filter, wherein a filter width of the time-domain filter is determined in dependence on a spatial distance between the antenna under test and the reference antenna, and a control device that is configured to control the transmitting module and the receiving module, such that the transmitting module emits a test signal by means of one of the two antennas and the receiving module receives the test signal by means of the other one of the two antennas, and the control device is further configured to convert the test signal received in the frequency domain into the time domain and to apply the time-domain filter to the received test signal in order to filter out test signal portions lying outside the filter width, and wherein the control device is configured to convert the filtered test signal present in the time domain back to the frequency domain, and wherein the control device is further configured to determine, from the test signal converted back to the frequency domain, the antenna gain $G_T(\vartheta, \varphi)$ of the antenna under test in dependence on a determined spatial angle by applying the following equation:

$$G_T(\vartheta, \varphi) = 10\log_{10}\left(\frac{P_{e\_T}}{P_{g\_R}}\right) - 20\log_{10}\left(\frac{\lambda}{4\pi r}\right) - $$

$$G_{REF}(\vartheta, \varphi) - \left(10\log\left(1 - \left(\frac{P_{e\_T}}{P_{e\_R}}\right)\Big|_{P_{g\_R}=0}\right) + \right.$$

-continued
$$\left. 10\log\left(1 - \left(\frac{P_{g\_T}}{P_{g\_R}}\right)\Big|_{P_{e\_R}=0}\right) + 20\log|\hat{p}_R \cdot \hat{p}_T|\right).$$

9. The antenna measuring station according to claim 8, wherein the reference antenna and the antenna under test are configured to transmit and/or receive radiation in a frequency range between 1 GHz and 10 THz, and in particular between 50 GHz and 1.1THz, or between 50 GHz and 100 GHz.

10. The antenna measuring station according to claim 8, wherein the control device is configured to determine the spatial distance between the reference antenna and the antenna under test and/or the orientation of the reference antenna relative to the antenna under test.

11. The antenna measuring station according to claim 10, wherein the antenna measuring station comprises a laser measuring device that is configured to determine the spatial distance and/or an angle of the reference antenna relative to the antenna under test.

12. The antenna measuring station according to claim 8, wherein the receiving module comprises a receiving stage that comprises, in signal propagation direction of the test signal, a switching matrix, an amplifier and a mixer.

13. The antenna measuring station according to claim 8, wherein the transmitting module comprises a transmitting stage, that comprises, in signal propagation direction of the test signal, a mixer, an amplifier and a switching matrix.

14. The antenna measuring station according to claim 12, wherein the reference antenna is a dual-polarized antenna and the control device is configured to rotate the polarization of the reference antenna by 90° by means of the switching matrix.

15. The antenna measuring station according to claim 8, wherein the antenna measuring station comprises a rotatable table on which the antenna to be tested can be disposed, and wherein the control device is configured to rotate the table, such that during a rotation of the table the antenna under test rotates together with the table in a first plane in order to change an azimuth angle $\varphi$ between the reference antenna and the antenna under test.

16. The antenna measuring station according to claim 8, wherein the antenna measuring station comprises a receiving device for movably receiving the reference antenna, and wherein the control device is configured to move the reference antenna along the receiving device relative to the antenna under test in a second plane perpendicular to the first plane in order to change an elevation angle between the reference antenna and the antenna under test.

17. The antenna measuring station according to claim 8, wherein the antenna measuring station comprises a test signal generator that is configured to generate the test signal and pass the same on to the transmitting module, wherein the transmitting module comprises a first integrated transmitting stage and a second integrated transmitting stage, wherein the first transmitting stage comprises a frequency mixer for upmixing the test signal into a first frequency band and the second transmitting stage comprises a frequency mixer for upmixing the test signal into a second frequency band, and wherein the transmitting module comprises a switch for selectively selecting the respective transmitting stage.

18. A non-transitory digital storage medium having a computer program stored thereon to perform the method for determining an antenna characteristic of an antenna under test in free space, the method comprising:

detecting measurement results of a transmitted power of a measurement signal transmitted between a reference antenna and an antenna under test, wherein detecting takes place in the frequency domain;

converting the detected measurement results into the time domain;

applying a time-domain filter to the measurement results converted into the time domain, wherein a filter width of the time-domain filter is determined in dependence on a spatial distance between the reference antenna and the antenna under test, such that measurement result portions resulting due to multipath propagation of the measurement signal between the reference antenna and the antenna under test are reduced or removed;

converting the filtered measurement results into the frequency domain; and determining the antenna gain $G_T(\vartheta,\varphi)$ of the antenna under test based on the filtered measurement results present in the frequency domain by applying the following equation:

$$G_T(\vartheta, \varphi) = 10\log_{10}\left(\frac{P_{e\_T}}{P_{g\_R}}\right) - 20\log_{10}\left(\frac{\lambda}{4\pi r}\right) - \\ G_{REF}(\vartheta, \varphi) - \left(10\log\left(1 - \left(\frac{P_{e\_T}}{P_{e\_R}}\right)\bigg|_{P_{g\_R}=0}\right) + \\ 10\log\left(1 - \left(\frac{P_{g\_T}}{P_{g\_R}}\right)\bigg|_{P_{e\_R}=0}\right) + 20\log|\hat{p}_R \cdot \hat{p}_T|\right)$$

when said computer program is run by a computer.

* * * * *